United States Patent
Song et al.

(10) Patent No.: US 8,332,723 B2
(45) Date of Patent: Dec. 11, 2012

(54) TRANSMITTING/RECEIVING SYSTEM AND METHOD OF PROCESSING DATA IN THE TRANSMITTING/RECEIVING SYSTEM

(75) Inventors: Jae Hyung Song, Seoul (KR); Gomer Thomas, Arlington, WA (US); In Hwan Choi, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 776 days.

(21) Appl. No.: 12/543,024

(22) Filed: Aug. 18, 2009

(65) Prior Publication Data

US 2010/0050051 A1 Feb. 25, 2010

Related U.S. Application Data

(60) Provisional application No. 61/089,909, filed on Aug. 19, 2008.

(51) Int. Cl.
*H03M 13/00* (2006.01)
(52) U.S. Cl. ...................................................... 714/762
(58) Field of Classification Search .......... 714/752–759, 714/761, 762, 764, 765, 784–788, 821
See application file for complete search history.

(56) References Cited

U.S. PATENT DOCUMENTS

| | | | | |
|---|---|---|---|---|
| 7,912,006 | B2* | 3/2011 | Lee et al. | 370/329 |
| 7,953,157 | B2* | 5/2011 | Song et al. | 375/240.25 |
| 7,986,715 | B2* | 7/2011 | Song et al. | 370/470 |
| 8,087,052 | B2* | 12/2011 | Lee et al. | 725/62 |
| 8,135,034 | B2* | 3/2012 | Song et al. | 370/474 |
| 2009/0083795 | A1* | 3/2009 | Lee et al. | 725/39 |

\* cited by examiner

*Primary Examiner* — Nadeem Iqbal
(74) *Attorney, Agent, or Firm* — Lee, Hong, Degerman, Kang & Waimey

(57) ABSTRACT

A receiving system and a data processing method are disclosed. The receiving system includes a signal receiving unit, an FIC handler, a manager, and a decoding unit. The signal receiving unit receives multiple Reed-Solomon (RS) frames comprising desired mobile service data for multiple ensembles and fast information channel (FIC) data including an indicator field, wherein the indicator field indicates whether or not the desired mobile service data are delivered through the multiple ensembles. The FIC handler obtains the indicator field from the FIC data. The manager determines at least one ensemble based upon the indicator field. And, the decoding unit decodes IP streams of the desired mobile service data from the RS frame of the determined ensemble.

8 Claims, 16 Drawing Sheets

FIG. 7

| Syntax | No. of Bits |
|---|---|
| FIC_chunk() {<br>  FIC_chunk_header()<br>  FIC_chunk_payload()<br>} | <br>5*8<br>var |

FIG. 8

| Syntax | No. of Bits | Format |
|---|---|---|
| FIC_chunk_header() {<br>  FIC_major_protocol_version<br>  FIC_minor_protocol_version<br>  FIC_chunk_header_extension_length<br>  ensemble_loop_header_extension_length<br>  MH_service_loop_extension_length<br>  reserved<br>  current_next_indicator<br>  transport_stream_id<br>  num_ensembles<br>} | <br>2<br>3<br>3<br>3<br>3<br>1<br>1<br>16<br>8 | <br>uimsbf<br>uimsbf<br>uimsbf<br>uimsbf<br>uimsbf<br>'1'<br>bsblf<br>uimsbf<br>uimsbf |

FIG. 9

| Syntax | No. of Bits | Format |
|---|---|---|
| FIC_chunk_payload() {     for (i=0; i<num_ensembles; i++) {        ensemble_id | 8 | uimsbf |
|        reserved | 3 | '111' |
|        ensemble_protocol_version | 5 | uimsbf |
|        SLT_ensemble_indicator | 1 | bslbf |
|        GAT_ensemble_indicator | 1 | bslbf |
|        reserved | 1 | '1' |
|        MH_service_signaling_channel_version | 5 | uimsbf |
|        num_MH_services | 8 | uimsbf |
|        for(j=0;j<num_MH_services;j++)} | | |
|           MH_service_id | 16 | uimsbf |
|           reserved | 3 | '111' |
|           service_span | 2 | uimsbf |
|           MH_service_status | 2 | uimsbf |
|           SP_indicator | 1 | bslbf |
|        }     }     FIC_chunk_stuffing() } | var | |

FIG. 10

| service_span | Meaning |
|---|---|
| '00' | All the IP streams that form this M/H service are delivered through this ensemble |
| '01' | The IP streams that form this M/H service are delivered through multiple ensembles. A meaningful version of this M/H service can be rendered with only IP stream components delivered through this ensemble. |
| '10' | The IP streams that form this M/H service are delivered through multiple ensembles. No meaningful version of this M/H service can be rendered with only the IP stream components delivered through this ensemble. |
| '11' | [Reserved for future ATSC use] |

FIG. 12

| Syntax | No. of Bits | Format |
|---|---|---|
| FIC_segment_header() { | | |
|    FIC_segment_type | 2 | uimsbf |
|    reserved | 2 | '11' |
|    FIC_chunk_major_protocol_version | 2 | uimsbf |
|    current_next_indicator | 1 | bslbf |
|    error_indicator | 1 | bslbf |
|    FIC_segment_num | 4 | uimsbf |
|    FIC_last_segment_num | 4 | uimsbf |
| } | | |

FIG. 13

| Syntax | No. of Bits | Format |
|---|---|---|
| FIC_chunk_payload() {  for (i=0; i<num_ensembles; i++) {  ensemble_id  VNI_ID  reserved  ensemble_protocol_version  SLT_ensemble_indicator  GAT_ensemble_indicator  reserved  MH_service_signaling_channel_version  num_MH_services  for(j=0;j<num_MH_services;j++)}  MH_service_id  MH_service_status  SP_indicator  }  }  FIC_chunk_stuffing()  } | 8 8 3 5 1 1 1 5 8  16 2 1  var | uimsbf uimsbf '111' uimsbf bslbf bslbf '1' uimsbf uimsbf  uimsbf uimsbf bslbf |

FIG. 14

| Syntax | No.of Bits | Format |
|---|---|---|
| service_map_table_section() { | | |
|   table_id | 8 | 0xDB |
|   section_syntax_indicator | 1 | '0' |
|   private_indicator | 1 | '1' |
|   reserved | 2 | '11' |
|   section_length | 12 | uimsbf |
|   table_id_extension { | | |
|     SMT_protocol_version | 8 | uimsbf |
|     ensemble_id | 8 | uimsbf |
|   } | | |
|   reserved | 2 | '11' |
|   version_number | 5 | uimsbf |
|   current_next_indicator | 1 | bslbf |
|   section_number | 8 | uimsbf |
|   last_section_number | 8 | uimsbf |
|   num_MH_services | 8 | uimsbf |
|   for (i=0;i<num_MH_services; i++) { | | |
|     MH_service_id | 16 | uimsbf |
|     service_span | 2 | uimsbf |
|     MH_service_status | 2 | uimsbf |
|     SP_indicator | 1 | bslbf |
|     short_MH_service_name_length /*m*/ | 3 | uimsbf |
|     short_MH_service_name | 16*m | |
|     reserved | 2 | '11' |
|     MH_service_category | 6 | uimsbf |
|     num_components | 5 | uimsbf |
|     IP_version_flag | 1 | bslbf |
|     source_IP_address_flag | 1 | bslbf |
|     MH_service_destination_IP_address_flag | 1 | bslbf |
|     if (source_IP_address_flag) | | |
|       source_IP_address | 32 or 128 | uimsbf |
|     if (MH_service_destination_IP_address_flag) | | |
|       MH_service_destination_IP_address | 32 or 128 | uimsbf |
|     for (j=0;j< num_components; j+ -) { | | |
|       reserved | 1 | '1' |
|       essential_component_indicator | 1 | bslbf |
|       component_destination_IP_address_flag | 1 | bslbf |
|       port_num_count | 5 | uimsbf |
|       component_destination_UDP_port_num | 16 | uimsbf |
|       if (component_destination_IP_address_flag) | | |
|         component_destination_IP_address | 32 or 128 | uimsbf |
|       reserved | 4 | '1111' |
|       num_component_level_descriptors | 4 | uimsbf |
|       for (k=0;k< num_components_level_descriptors; k++) { | | |
|         component_level_descriptor() | var | |
|       } | | |
|     } | | |
|     reserved | 4 | '1111' |
|     num_MH_service_level_descriptors | 4 | uimsbf |
|     for (m=0; m<num_MH_service_level_descriptors; m++) { | | |
|       MH_service_level_descriptor() | var | |
|     } | | |
|   } | | |
|   reserved | 4 | '1111' |
|   num_ensemble_level_descriptors | 4 | uimsbf |
|   for (n=0; n<num_ensemble_level_descriptors; n++) { | | |
|     ensemble_level_descriptor() | var | |
|   } | | |
| } | | |

TRANSMITTING/RECEIVING SYSTEM AND METHOD OF PROCESSING DATA IN THE TRANSMITTING/RECEIVING SYSTEM

This application claims the benefit of U.S. Provisional Application No. 61/089,909, filed on Aug. 19, 2008, which is hereby incorporated by reference as if fully set forth herein.

BACKGROUND OF THE INVENTION

1. Field of the Invention

The present invention relates to a transmitting system for transmitting data for broadcast, a receiving system (or receiver) for receiving data transmitted from the transmitting system, and a method of processing data in the transmitting system and the receiving system (or receiver).

2. Discussion of the Related Art

The Vestigial Sideband (VSB) transmission mode, which is adopted as the standard for digital broadcasting in North America and the Republic of Korea, is a system using a single carrier method. Therefore, the receiving performance of the receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a digital broadcasting transmitting/receiving system and a data processing method that substantially obviate one or more problems due to limitations and disadvantages of the related art.

An object of the present invention is to provide a digital broadcasting transmitting/receiving system and a data processing method that are highly resistant to channel changes and noise.

Another object of the present invention is to provide a digital broadcast receiving system and a data processing method of the same that can receive and process a mobile service through multiple ensembles.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a data processing method in a receiving system includes receiving multiple Reed-Solomon (RS) frames comprising desired mobile service data for multiple ensembles and fast information channel (FIC) data including an indicator field, the indicator field indicating whether or not the desired mobile service data are delivered through the multiple ensembles, obtaining the indicator field from the FIC data, determining at least one ensemble based upon the indicator field, and decoding IP streams of the desired mobile service data from the RS frame of the determined ensemble.

Herein, at least one ensemble that is to be decoded may be determined based upon the indicator field. A number of ensembles that are to be decoded may be determined based upon a number of RS frame decoders within the receiving system. And, the step of decoding IP streams may further include decoding IP streams of the desired mobile service data from the RS frame of the determined ensemble so as to render a mobile service.

Also, the FIC data may consist of a 5-byte FIC chunk header and a variable-length FIC chunk payload including signaling information between at least one ensemble and at least one mobile service. Herein, the indicator field may be included in the FIC chunk payload. When IP streams of the desired mobile service data are included in multiple ensembles, the indicator field may indicate whether or not the desired mobile service data can be rendered to at least one IP stream component. Herein, the at least one IP stream component is transmitted through an RS frame of the corresponding ensemble.

According to another aspect of the present invention, a receiving system includes a signal receiving unit, an FIC handler, a manager, and a decoding unit. The signal receiving unit receives multiple Reed-Solomon (RS) frames comprising desired mobile service data for multiple ensembles and fast information channel (FIC) data including an indicator field, wherein the indicator field indicates whether or not the desired mobile service data are delivered through the multiple ensembles. The FIC handler obtains the indicator field from the FIC data. The manager determines at least one ensemble based upon the indicator field. And, the decoding unit decodes IP streams of the desired mobile service data from the RS frame of the determined ensemble.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7 illustrates a syntax structure of an FIC chunk according to an embodiment of the present invention;

FIG. 8 illustrates a syntax structure of an FIC chunk header according to an embodiment of the present invention;

FIG. 9 illustrates a syntax structure of an FIC chunk payload according to an embodiment of the present invention;

FIG. 10 illustrates an exemplary significance defined in a value of the service_span field according to the present invention;

FIG. 12 illustrates a syntax structure of an FIC segment header according to an embodiment of the present invention;

FIG. 13 illustrates a syntax structure of an FIC chunk payload according to another embodiment of the present invention;

FIG. 14 illustrates a syntax structure of a service map table (SMT) section according to an embodiment of the present invention;

DETAILED DESCRIPTION OF THE INVENTION

Figure 1:
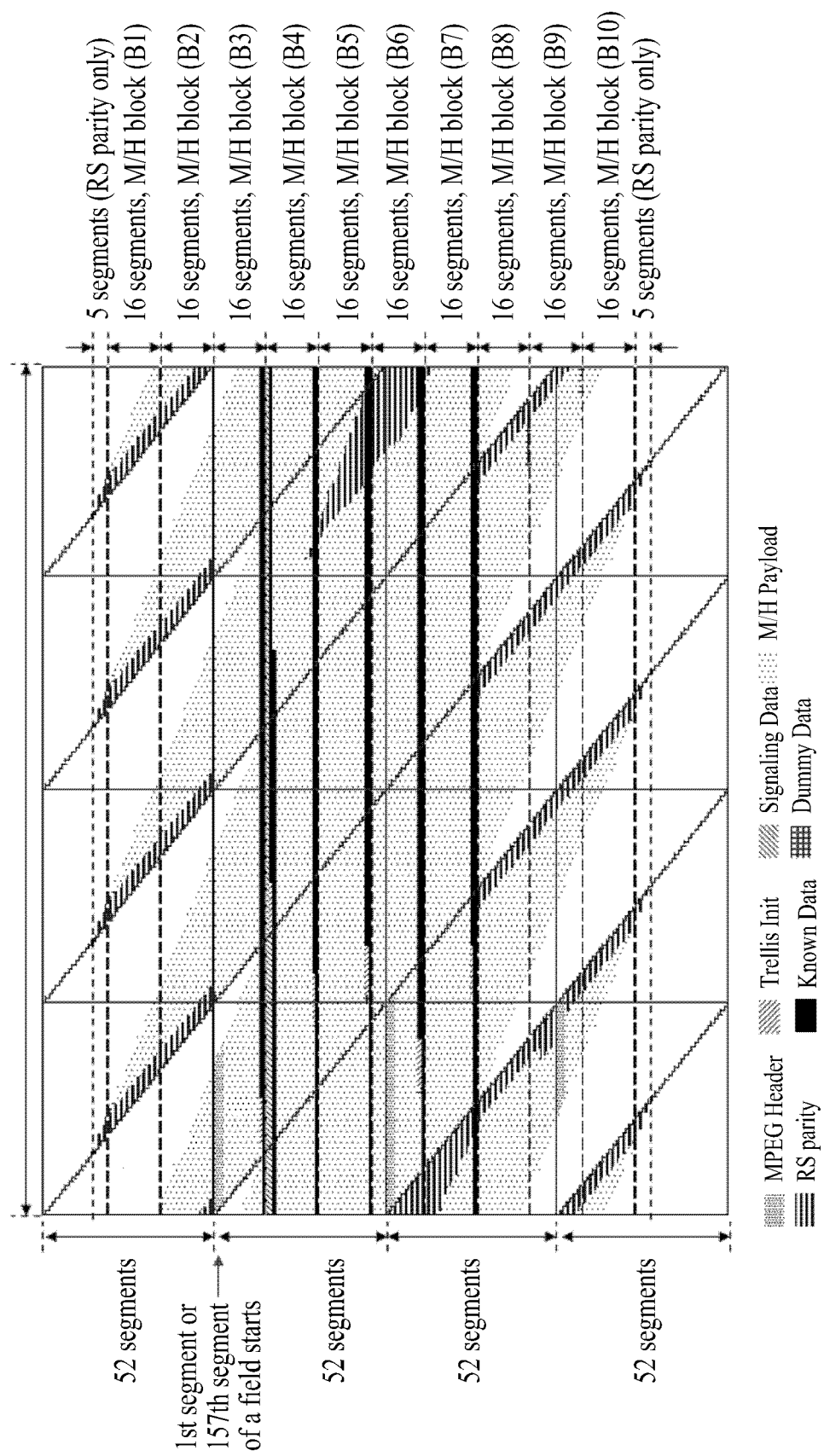
FIG. 1 illustrates an exemplary structure of a data group according to the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H" (or MH) corresponds to the initials of "mobile" and "handheld" and represents the opposite concept of a fixed-type system. Furthermore, the M/H service data may include at least one of mobile service data, and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data. Also, data required for mobile service according to the present invention will also be referred to as "mobile service data" for simplicity.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data so as to be received by the conventional receiving system. Herein, the main service data and the mobile service data are multiplexed to the same physical channel and then transmitted.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

According to an embodiment of the present invention, the transmitting system and the receiving system operate two different types of data channels: an RS frame data channel for transmitting contents and a fast information channel (FIC) data channel for acquiring service.

More specifically, the present invention can signal mapping information between an ensemble and a mobile service by using an FIC chunk, and can divide and transmit the FIC chunk into FIC segment units, thereby enabling a receiving system to perform quick service acquisition.

Also, by using a plurality of RS frame decoders, the present invention can receive and process a single mobile service through multiple ensembles.

Data Format Structure

The data structure used in the mobile broadcasting technology according to the embodiment of the present invention may include a data group structure and an RS frame structure, which will now be described in detail.

FIG. 1 illustrates an exemplary structure of a data group according to the present invention. FIG. 1 shows an example of dividing a data group according to the data structure of the present invention into 10 M/H blocks (i.e., M/H block 1 (B1) to M/H block 10 (B10)). In this example, each M/H block has the length of 16 segments. Referring to FIG. 1, only the RS parity data are allocated to portions of the 5 segments before the M/H block 1 (B1) and the 5 segments following the M/H block 10 (B10). The RS parity data are excluded in regions A to D of the data group. More specifically, when it is assumed that one data group is divided into regions A, B, C, and D, each M/H block may be included in any one of region A to region D depending upon the characteristic of each M/H block within the data group.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

In the data group, the data included in a RS frame will be referred to as "mobile service data" for simplicity. The RS frame data (or the data of the RS frame) will be described in more detail in a later process.

Referring to FIG. 1, M/H block 4 (B4) to M/H block 7 (B7) correspond to regions without interference of the main service data. M/H block 4 (B4) to M/H block 7 (B7) within the data group shown in FIG. 1 correspond to a region where no interference from the main service data occurs. In this example, a long known data sequence is inserted at both the beginning and end of each M/H block. In the description of the present invention, the region including M/H block 4 (B4) to M/H block 7 (B7) will be referred to as "region A (=B4+B5+B6+B7)". As described above, when the data group includes region A having a long known data sequence inserted at both the beginning and end of each M/H block, the receiving system is capable of performing equalization by using the channel information that can be obtained from the known data. Therefore, the strongest equalizing performance may be yielded (or obtained) from one of region A to region D.

In the example of the data group shown in FIG. 1, M/H block 3 (B3) and M/H block 8 (B8) correspond to a region having little interference from the main service data. Herein, a long known data sequence is inserted in only one side of each M/H block B3 and B8. More specifically, due to the interference from the main service data, a long known data sequence is inserted at the end of M/H block 3 (B3), and another long known data sequence is inserted at the beginning of M/H block 8 (B8). In the present invention, the region including M/H block 3 (B3) and M/H block 8 (B8) will be referred to as "region B (=B3+B8)". As described above, when the data group includes region B having a long known data sequence inserted at only one side (beginning or end) of each M/H block, the receiving system is capable of performing equalization by using the channel information that can be obtained from the known data. Therefore, a stronger equalizing performance as compared to region C/D may be yielded (or obtained).

Referring to FIG. 1, M/H block 2 (B2) and M/H block 9 (B9) correspond to a region having more interference from the main service data as compared to region B. A long known data sequence cannot be inserted in any side of M/H block 2 (B2) and M/H block 9 (B9). Herein, the region including M/H block 2 (B2) and M/H block 9 (B9) will be referred to as "region C (=B2+B9)". Finally, in the example shown in FIG. 1, M/H block 1 (B1) and M/H block 10 (B10) correspond to a region having more interference from the main service data as compared to region C. Similarly, a long known data sequence cannot be inserted in any side of M/H block 1 (B1) and M/H block 10 (B10). Herein, the region including M/H block 1 (B1) and M/H block 10 (B10) will be referred to as "region D (=B1+B10)". Since region C/D is spaced further apart from the known data sequence, when the channel environment undergoes frequent and abrupt changes, the receiving performance of region C/D may be deteriorated.

Additionally, the data group includes a signaling information area wherein signaling information is assigned (or allocated). In the present invention, the signaling information area may start from the $1^{st}$ segment of the $4^{th}$ M/H block (B4) to a portion of the $2^{nd}$ segment. According to an embodiment of the present invention, the signaling information area for inserting signaling information may start from the $1^{st}$ segment of the $4^{th}$ M/H block (B4) to a portion of the $2^{nd}$ segment. More specifically, 276 (=207+69) bytes of the $4^{th}$ M/H block (B4) in each data group are assigned as the signaling information area. In other words, the signaling information area consists of 207 bytes of the $1^{st}$ segment and the first 69 bytes of the $2^{nd}$ segment of the $4^{th}$ M/H block (B4). The $1^{st}$ segment of the $4^{th}$ M/H block (B4) corresponds to the $17^{th}$ or $173^{rd}$ segment of a VSB field.

Herein, the signaling data transmitted through the signaling information area may be identified by two different types of channel data: a transmission parameter channel (TPC) data and a fast information channel (FIC) data.

Also, the TPC data includes parameters that are mostly used in a physical layer module. And, since the TPC data are transmitted without being interleaved, the TPC data may be accessed by slot unit in the receiving system. The FIC data are provided in order to enable the receiving system to perform fast service acquisition. Herein, the FIC data include cross layer information between a physical layer and an upper layer. The FIC data are interleaved in sub-frame units and then transmitted.

For example, when the data group includes 6 known data sequences, as shown in FIG. 1, the signaling information area is located between the first known data sequence and the second known data sequence. More specifically, the first known data sequence is inserted in the last 2 segments of the $3^{rd}$ M/H block (B3), and the second known data sequence in inserted in the $2^{nd}$ and $3^{rd}$ segments of the $4^{th}$ M/H block (B4). Furthermore, the $3^{rd}$ to $6^{th}$ known data sequences are respectively inserted in the last 2 segments of each of the $4^{th}$, $5^{th}$, $6^{th}$, and $7^{th}$ M/H blocks (B4, B5, B6, and B7). The $1^{st}$ and $3^{rd}$ to $6^{th}$ known data sequences are spaced apart by 16 segments.

Figure 2:
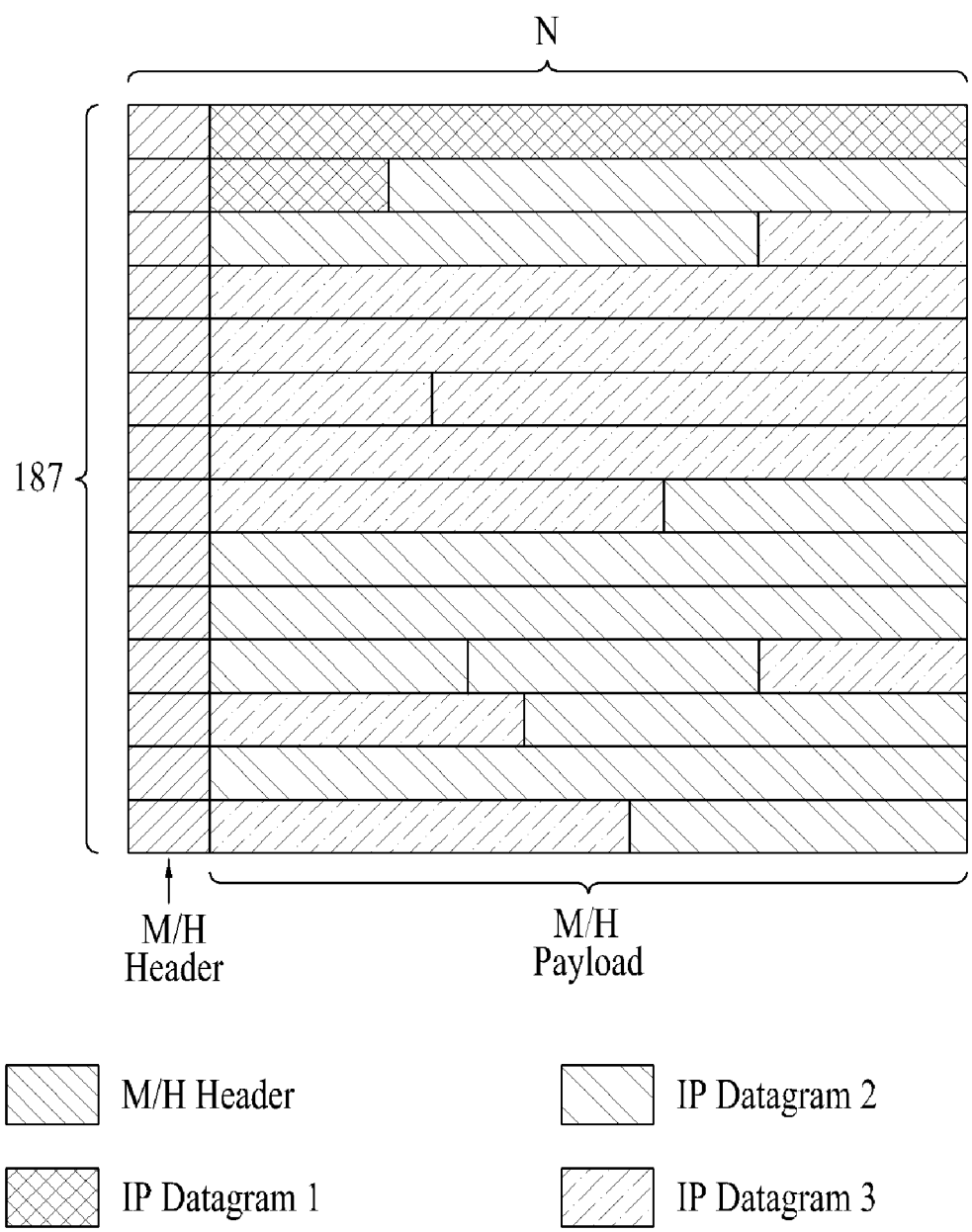
FIG. 2 illustrates an RS frame according to an embodiment of the present invention.

FIG. 2 illustrates an RS frame according to an embodiment of the present invention.

The RS frame is received for each M/H frame in a condition where the receiving system is switched to a time-slicing mode.

The RS frame according to an embodiment of the present invention is configured of multiple M/H transport packets (TPs). Each M/H TP consists of a 2-byte M/H header and a (N−2)-byte M/H payload. The M/H payload may include at least one of an IP datagram of mobile service data, an IP datagram of an SMT, and an IP datagram of an SGDD.

More specifically, one RS frame includes an IP datagram of each mobile service data set. Also, an IP datagram of an SMT section is included in each of the RS frames. According to an embodiment of the present invention, the IP datagram of the SMT or the IP datagram of a service signaling channel transmitting the SMT comprises a well-known IP destination address and a well-known destination UDP port number. And, the IP datagram is included in the RS frame so as to be received.

Furthermore, an IP datagram of the SGDD may be included in the RS frame. According to an embodiment of the present invention, the access information of the SGDD or the access information of the service guide announcement channel transmitting the SGDD is signaled to the SMT. The access information of the service guide announcement channel includes service guide bootstrap information.

Three types of IP datagrams (IP datagram 1, IP datagram 2, and IP datagram 3) are included in the RS frame shown in FIG. 2, one of the three IP datagrams is designated for the SMT. The remaining IP datagrams may correspond to IP datagrams of mobile service data or IP datagrams designated for the SGDD. In the transmitting system, RS-encoding is performed on the RS frame in a column direction, and CRC-encoding is performed on the RS frame in a row direction. Then, the processed RS frame is allocated to the corresponding regions within multiple data groups, thereby being transmitted. In the description of the present invention, all of the data included in the RS frame will be referred to as mobile service data for simplicity.

Data Transmission Structure

Figure 3:
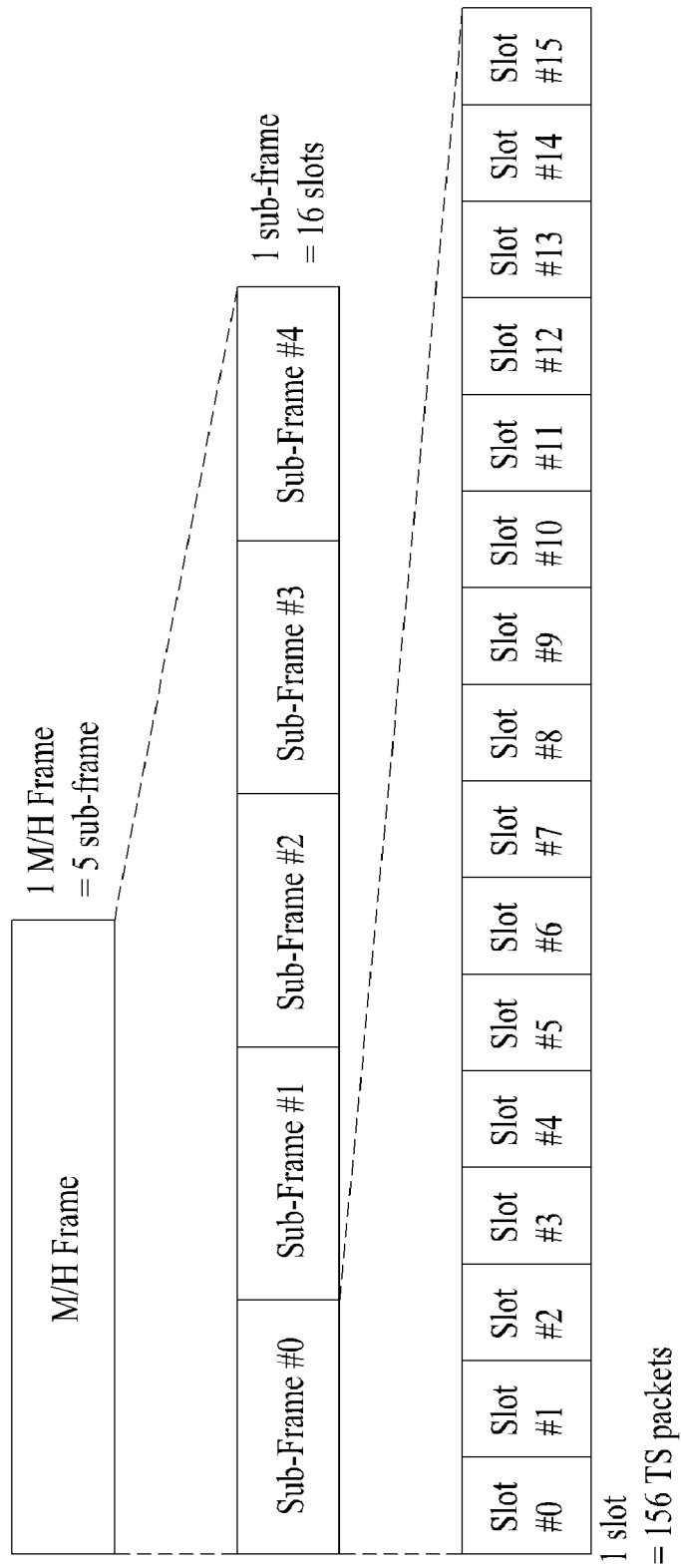
FIG. 3 illustrates an example of an M/H frame structure for transmitting and receiving mobile service data according to the present invention.

FIG. 3 illustrates a structure of an M/H frame for transmitting and receiving mobile service data according to the present invention. In the example shown in FIG. 3, one M/H frame consists of 5 sub-frames, wherein each sub-frame includes 16 slots. In this case, the M/H frame according to the present invention includes 5 sub-frames and 80 slots. Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

One VSB frame consists of 2 VSB fields (i.e., an odd field and an even field). Herein, each VSB field includes a field synchronization segment and 312 data segments. The slot corresponds to a basic time unit for multiplexing the mobile service data and the main service data.

Herein, one slot may either include the mobile service data or be configured only of the main service data.

If the first 118 data packets within the slot correspond to a data group, the remaining 38 data packets become the main service data packets. In another example, when no data group exists in a slot, the corresponding slot is configured of 156 main service data packets.

Meanwhile, the data within one RS frame may be assigned either to all of regions A/B/C/D within the corresponding data group, or to at least one of regions A/B/C/D. In the embodiment of the present invention, the data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

According to the embodiment of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the data within one RS frame are assigned either to all of regions A/B/C/D within the corresponding data group, one parade transmits one RS frame. Conversely, when the data within one RS frame are assigned either to at least one of regions A/B and regions C/D, one parade may transmit up to 2 RS frames. More specifically, the RS frame mode indicates whether a parade transmits one RS frame, or whether the parade transmits two RS frames. Such RS frame mode is transmitted as the TPC data. Table 1 below shows an example of the RS frame mode.

TABLE 1

| RS frame mode (2 bits) | Description |
| --- | --- |
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the system can be capable of responding promptly and effectively to any burst error that may occur within a sub-frame.

Furthermore, the method of assigning parades may be identically applied to all M/H frames or differently applied to each M/H frame. According to the embodiment of the present invention, the parades may be assigned differently for each M/H frame and identically for all sub-frames within an M/H frame. More specifically, the M/H frame structure may vary by M/H frame units. Thus, an ensemble rate may be adjusted on a more frequent and flexible basis.

That is, the concept of an M/H ensemble is applied in the embodiment of the present invention, thereby defining a collection (or group) of services. Each M/H ensemble carries the same QoS and is coded with the same FEC code. Also, each M/H ensemble has the same unique identifier (i.e., ensemble ID) and corresponds to consecutive RS frames. Furthermore, an ensemble has a unique identifier (i.e., ensemble id), and the ensemble corresponds to a collection of consecutive RS frames with the same FEC codes. At this point, each RS frame is encapsulated to transport packets including IP streams. In other words, the RS frame corresponds to a two-dimensional data frame through which an ensemble is RS-CRC encoded.

Figure 4:
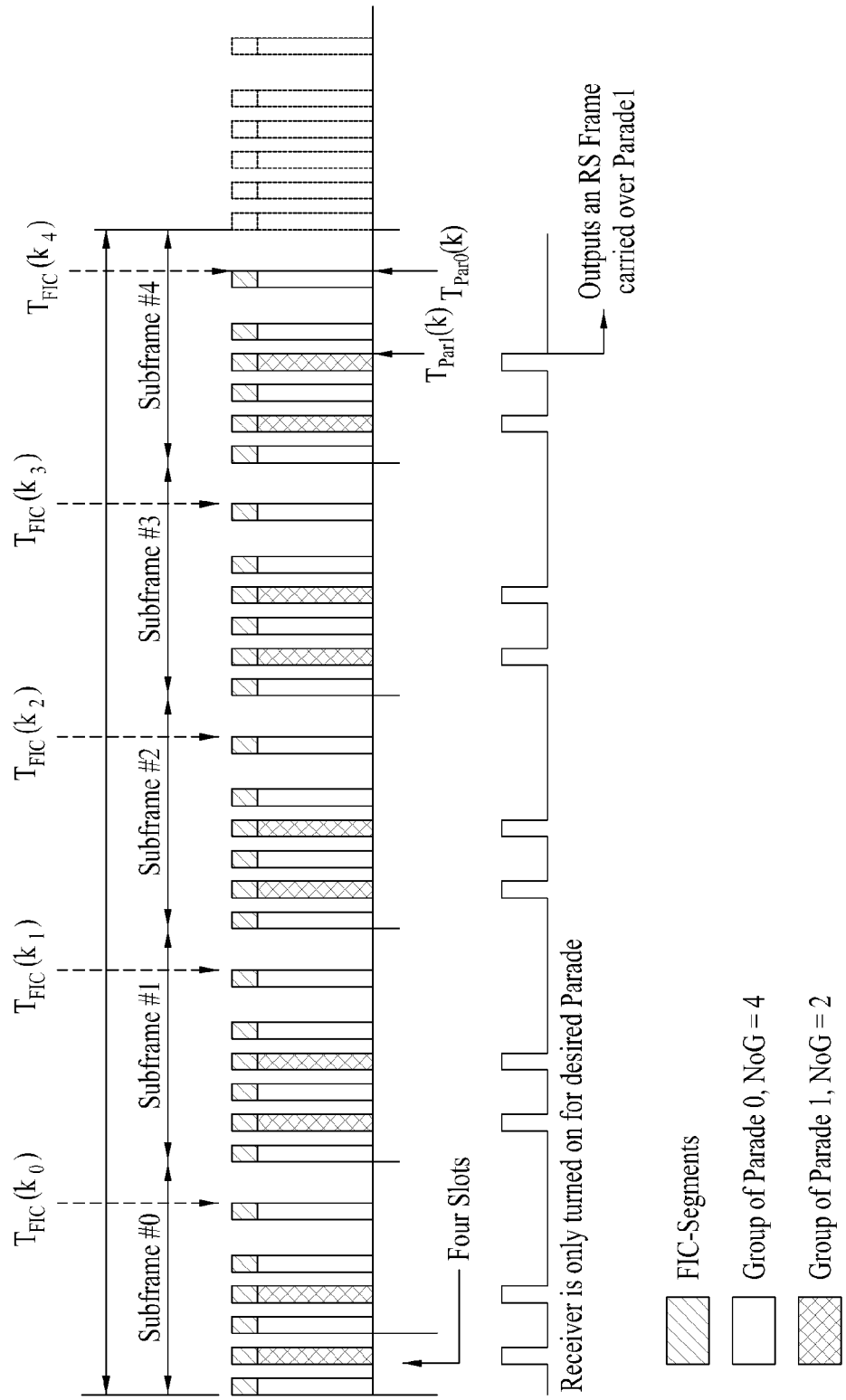
FIG. 4 illustrates a data transmission structure in a physical layer according to an embodiment of the present invention.

FIG. 4 illustrates a data transmission structure in a physical layer according to an embodiment of the present invention. More specifically, FIG. 4 shows an example of FIC data being included in each data group and transmitted. As described above, an M/H frame for approximately 0.968 seconds is divided into 5 sub-frames, wherein data groups corresponding to multiple ensembles exist in combination within each sub-frame. Also, the data groups corresponding to each ensemble are interleaved in M/H frame units, so as to configure an RS frame belonging to one ensemble. In FIG. 4, 2 ensembles (wherein NoG=4 and NoG=3) exist in each sub-frame. Furthermore, a predetermined portion (e.g., 37 bytes/data group) of each data group is used for the purpose of separately delivering encoded FIC data apart from the RS frame data channel. The FIC region assigned to each data group consists of one FIC segment. Herein, each of the FIC segments is interleaved in sub-frame units. For example, RS-encoding and SCCC encoding processes are applied to the RS frame data, and RS encoding and PCCC encoding processes are applied to the FIC data. Also, as well as the FIC data, the RS encoding and PCCC encoding processes are applied to the TPC data. More specifically, (187+P,187)-RS encoding process is applied to the RS frame data, (51,37)-RS encoding process is applied to the FIC data, and (18,10)-RS encoding process is applied to the TPC. Herein, P is the number of parity bytes.

Virtual Network Interface (VNI)

If the digital broadcast receiving system is provided with only one RS frame decoder, the receiving system may be able to receive only the mobile service data belonging to one ensemble in a given time. For such reason, one ensemble is set as one IP network interface. More specifically, one ensemble is mapped to one IP network interface. At this point, collision of IP addresses among IP streams that are being transmitted through the corresponding IP network interface should be avoided. In other words, IP streams being transmitted through a single IP network interface should have different IP addresses each other.

Meanwhile, if the digital broadcast receiving system is provided with a plurality of RS frame decoders, the receiving system may simultaneously receive mobile service data belonging to multiple ensembles by using the plurality of RS frame decoders, thereby decoding the received mobile service data. In this case, multiple IP network interfaces may be set-up. More specifically, when multiple ensembles can be simultaneously received and processed by using a plurality of RS frame decoders, based upon the characteristics and requirements of a specific mobile service, a different forward error correction (FEC) may be applied for each component configuring the corresponding mobile service. However, in this case, a method for preventing IP address collision between IP streams is required.

According to an embodiment of the present invention, multiple ensembles are used to set-up one virtual network interface (VNI). Herein, VNI information is included in the FIC chunk.

More specifically, the VNI configures one local IP network interface by using multiple IP network interfaces (i.e., ensembles). And, an IP application is operated within the corresponding local IP network interface. At this point, the VNI information, which is described in the FIC chunk, indicates whether or not the corresponding mobile service is being transmitted through multiple ensembles. Additionally, the VNI information also indicates whether the corresponding mobile service can be rendered (or whether service rendering of the corresponding mobile service is available) only to components being transmitted through a single ensemble, or the VNI information indicates whether rendering can be performed only when all components being transmitted through multiple ensembles are received. Herein, the availability of service rendering represents a state wherein, by decoding the corresponding components, the user may be provided with a meaningful service.

The receiving system sets-up a VNI with at least one ensemble including a desired mobile service based upon the VNI information, so as to configure an IP protocol stack.

Figure 5:
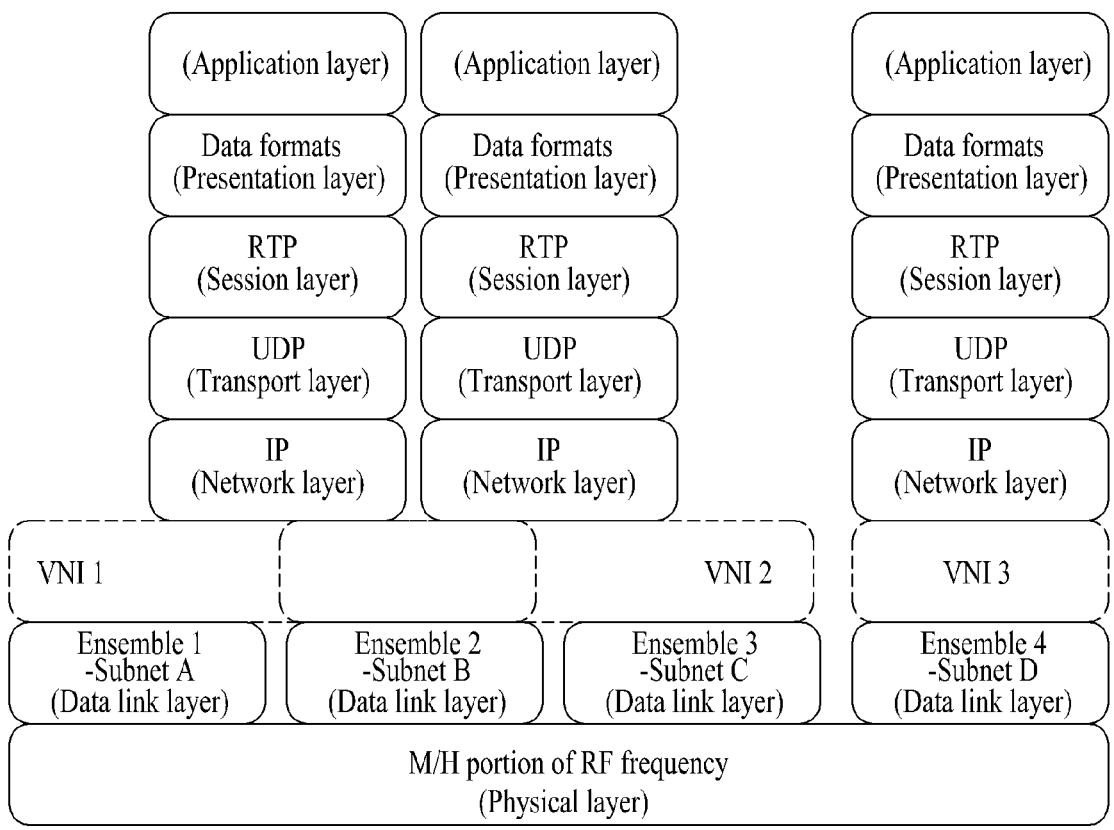
FIG. 5 illustrates a diagram showing a concept of virtual network interface and a relationship with IP protocol stack according to an embodiment of the present invention.

FIG. 5 illustrates an exemplary structure of an IP protocol stack adopting the concept of a VNI. Referring to FIG. 5, ensemble 1 (Subnet A) and ensemble 2 (Subnet B) configure a VNI. And, an IP protocol stack is operated within the VNI. Similarly, ensemble 2 (Subnet B) and ensemble 3 (Subnet C) configure another VNI. And, another IP protocol stack is operated within the VNI. Furthermore, another VNI is configured by using a single ensemble 4 (Subnet D). Herein, each IP protocol stack includes a network layer, a transport layer, a session layer, a presentation layer, and an application layer. Therefore, when the receiving system is provided with a plurality of RS frame decoder, a single mobile service may be transmitted and/or received and processed through multiple ensembles.

Figure 6:
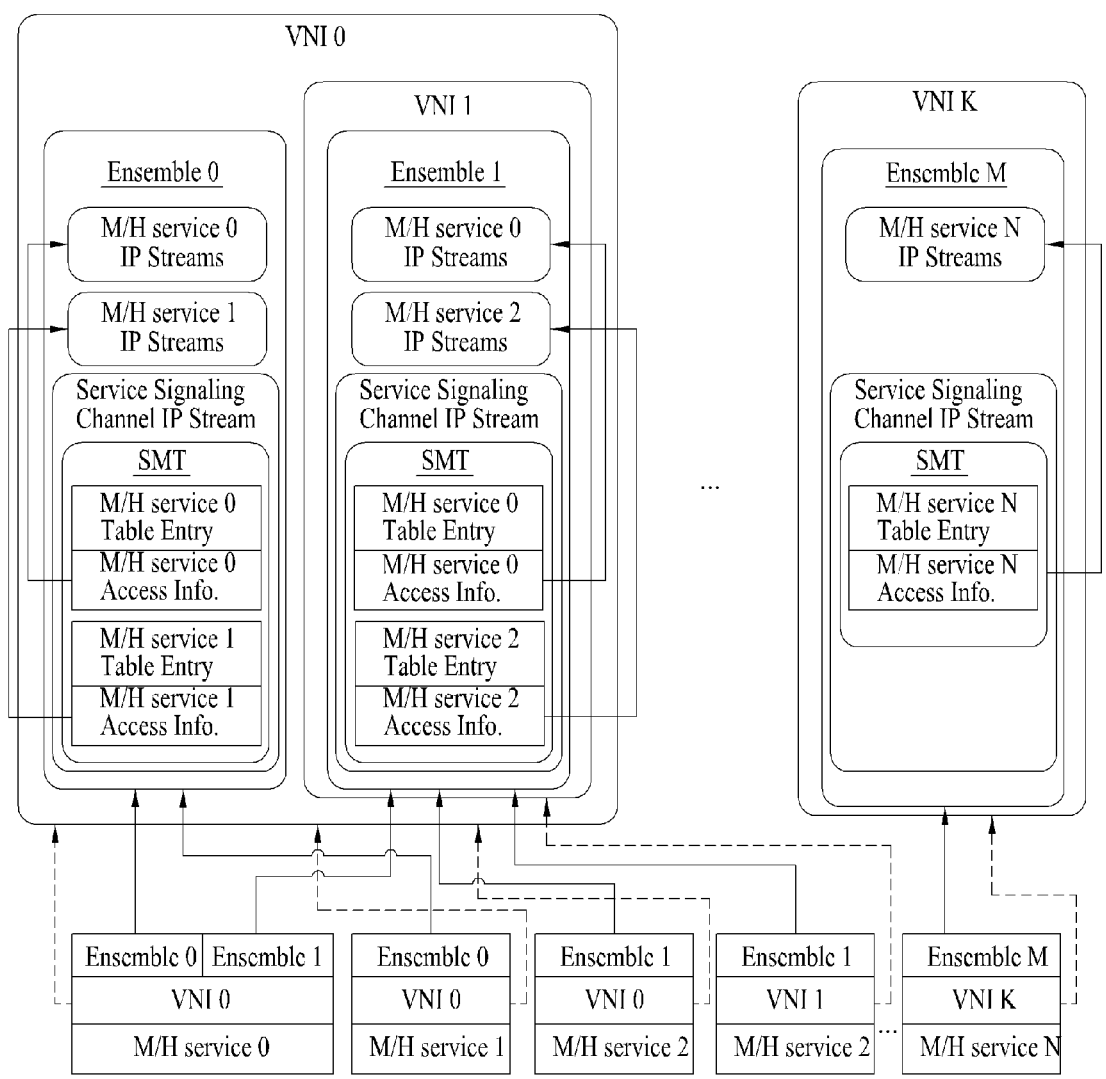
FIG. 6 illustrates a hierarchical signaling structure according to an embodiment of the present invention.

FIG. 6 illustrates a relation between an FIC chunk, ensembles, VNIs, and mobile services (i.e., M/H services) through a hierarchical signaling structure according to the present invention. Referring to FIG. 6, VNI 0 is configured of ensemble 0 and ensemble 1, VNI 1 is configured only of ensemble 1, and VNI K is configured only of ensemble K. At this point, ensemble 0 includes 2 mobile services (i.e., M/H service 0 and M/H service 1), and ensemble 1 also includes 2 mobile services (i.e., M/H service 0 and M/H service 2). More specifically, it is apparent that mobile service 0 (i.e., M/H service 0) is simultaneously transmitted through ensemble 0 and through ensemble 1.

For example, ensemble 0 includes an IP stream of mobile service 0 and an IP stream of mobile service 1. Furthermore, an SMT included in ensemble 0 comprises information required for receiving the IP streams of mobile service 0 and mobile service 1 (i.e., M/H service 0 table entry, M/H service 0 access info, M/H service 1 table entry, and M/H service 1 access info). More specifically, the SMT provides ensemble level signaling information. Each SMT provides IP access information of each mobile service belonging to a respective ensemble wherein each SMT is included. Moreover, the SMT provides IP stream component level information required for the respective mobile service.

Also, the FIC chunk provides signaling information of a physical channel level. In other words, the FIC chunk includes ensemble information (which corresponds to an ensemble_id field, and which is marked as "Ensemble 0", "Ensemble 1", . . . , "Ensemble M" in FIG. 6), VNI information (which corresponds to a service_span field or VNI_ID field, and which is marked as "VNI 0", "VNI 1", . . . , "VNI K" in FIG. 6), and mobile service information (which corresponds to a service_id field, and which is marked as "M/H Service 0", "M/H Service 1", . . . , "M/H Service N" in FIG. 6).

According to an embodiment of the present invention, the VNI information is included in the payload of the FIC chunk.

FIG. 7 illustrates a syntax structure of an FIC chunk that maps the relation between a mobile service and an ensemble through the FIC. Herein, the FIC chunk consists of an FIC chunk header and an FIC chunk payload.

FIG. 8 illustrates a syntax structure of an FIC chunk header according to an embodiment of the present invention.

Herein, the FIC chunk header signals a non-backward compatible major protocol version change in a corresponding FIC chunk and also signals a backward compatible minor protocol version change. Furthermore, the FIC chunk header also signals the length for an extension of an FIC chunk header, the length for an extension of an ensemble loop header, and the length for an extension of a mobile service loop that can be generated by a minor protocol version change.

According to an embodiment of the present invention, a receiver (or receiving system) that can adopt the corresponding minor protocol version change may process the corresponding extension field, whereas a legacy (or conventional) receiver that cannot adopt the corresponding minor protocol version change may skip the corresponding extension field by using each of the corresponding length information. For example, in case of a receiving system that can accept the corresponding minor protocol version change, the directions given in the corresponding extension field may be known. Furthermore, the receiving system may perform operations in accordance with the directions given in the corresponding extension field.

According to an embodiment of the present invention, a minor protocol version change in the FIC chunk is performed by inserting additional fields at the respective end portion of the FIC chunk header, the ensemble loop header, and the mobile service loop included in the previous minor protocol version FIC chunk. According to an embodiment of the present invention, in any other case, or when the length of the additional fields cannot be expressed (or indicated) by each extension length within the FIC chunk header, or when a specific field within the FIC chunk payload is missing (or cannot be found), or when the number of bits being assigned to the corresponding field or the definition of the corresponding field is changed (or altered), the major protocol version of the corresponding FIC chunk is updated.

Also, the FIC chunk header signals whether the data of a corresponding FIC chink payload carry mapping information between an ensemble and a mobile service within the current M/H frame, or whether the data of a corresponding FIC chink payload carry mapping information between an ensemble and a mobile service within the next M/H frame. Furthermore, the FIC chunk header also signals the number of transport stream IDs of a mobile service through which the current FIC chunk is being transmitted and the number of ensembles being transmitted through the corresponding mobile service.

Accordingly, for this, the FIC chunk header may include an FIC_major_protocol_version field, an FIC_minor_protocol_version field, an FIC_chunk_header_extension_length field, an ensemble_loop_header_extension_length field, an M/H_service_loop_extension_length field, a current_next_indicator field, a transport_stream_id field, and a num_ensembles field.

The FIC_major_protocol_version field corresponds to a 2-bit unsigned integer field that represents the major version level of an FIC chunk syntax. A change in the major version level shall indicate a change in a non-backward-compatible level. When the FIC_major_protocol_version field is updated, legacy (or conventional) receivers, which can process the prior major protocol version of an FIC chunk protocol, shall avoid processing the FIC chunk.

The FIC_minor_protocol_version field corresponds to a 3-bit unsigned integer field that represents the minor version level of an FIC chunk syntax. When it is assumed that the major version level remains the same, a change in the minor version level shall indicate a change in a backward-compatible level. More specifically, when the FIC_minor_protocol_version field is updated, legacy (or conventional) receivers, which can process the same major version of the FIC chunk protocol, may process a portion of the FIC chunk.

The FIC_Chunk_header_extension_length field corresponds to a 3-bit unsigned integer field identifying the length of FIC chunk header extension bytes, which are generated by the minor protocol version update of the corresponding FIC chunk. Herein, the extension bytes are appended (or added) at the end of the corresponding FIC chunk header.

The ensemble_header_extension_length field corresponds to a 3-bit unsigned integer field identifying the length of the ensemble header extension bytes, which are generated by the minor protocol version update of the corresponding FIC chunk. Herein, the extension bytes are appended (or added) at the end of the corresponding ensemble loop header.

Also, the M/H_service_loop_extension_length field corresponds to a 4-bit unsigned integer field identifying the length of the ensemble header extension bytes, which are generated by the minor protocol version update of the M/H service loop. Herein, the extension bytes are appended (or added) at the end of the corresponding M/H service loop.

For example, it is assumed that the FIC chunk includes 2 ensembles (i.e., ensemble 0 and ensemble 1). more specifically, it is assumed that two mobile services are transmitted through ensemble 0, and one mobile service is transmitted through ensemble 1. At this point, when the minor protocol version of the FIC chunk is changed, and the FIC chunk header is expanded by 1 byte, the FIC_chunk_header_extension_length field is marked as '001'. In this case, a 1-byte expansion field (i.e., FIC_Chunk_header_extension_bytes field) is added at the end of the FIC chunk header. Also, the legacy receiver skips the 1-byte expansion field, which is added at the end of the FIC chunk header, without processing the corresponding expansion field.

Additionally, when the ensemble loop header within the FIC chunk is expanded by 2 bytes, the ensemble_loop_header_extension_length field is marked as '010'. In this case, a 2-byte expansion field (i.e., Ensemble_loop_header_extension_bytes field) is respectively added at the end of the ensemble 0 loop header and at the end of the ensemble 1 loop header. Also, the legacy receiver skips the 2-byte expansion fields, which are respectively added at the end of the ensemble 0 loop header and at the end of the ensemble 1 loop header, without processing the corresponding 2-byte expansion fields.

Furthermore, when the mobile service loop of the FIC chunk is expanded by 1 byte, the M/H_service_loop_extension_length field is marked as '001'. In this case, a 1-byte expansion field (i.e., M/H_service_loop_extension_bytes field) is respectively added at the end of 2 mobile service loops being transmitted through ensemble 0 loop and at the end of 1 mobile service loop being transmitted through the ensemble 1 loop. And, the legacy receiver skips the 1-byte expansion fields, which are respectively added at the end of 2 mobile service loops being transmitted through ensemble 0 loop and at the end of 1 mobile service loop being transmitted through the ensemble 1 loop, without processing the corresponding 1-byte expansion fields.

As described above, when the FIC_minor_protocol version field is changed, a legacy (or conventional) receiver (i.e., a receiver that cannot adopt the minor protocol version change in the corresponding FIC chunk) processes the fields apart from the extension field. Thereafter, the legacy receiver uses the FIC_chunk_header_extension_length field, the ensemble_loop_header_extension_length field, and the M/H_service_loop_extension_length field, so as to skip the corresponding expansion fields without processing the corresponding fields. When using a receiving system that can adopt the corresponding minor protocol version change of the FIC chunk, each length field is used to process even the corresponding expansion field.

The current_next_indicator field corresponds to a 1-bit indicator, which, when set to '1', indicates that the corresponding FIC chunk is currently applicable.

Alternatively, when the current_next_indicator field is set to '0', the current_next indicator field indicates that the corresponding FIC chunk will be applicable for the next M/H frame. Herein, when the current_next_indicator field is set to '0', the most recent version of the FIC chunk being transmitted with the current_next_indicator field set to '1' shall be currently applicable. More specifically, when the current_next_indicator field value is set to '1', this indicates that the corresponding FIC chunk transmits the signaling data of the current M/H frame. Further, when the current_next_indicator field value is set to '0', this indicates that the corresponding FIC chunk transmits the signaling data of the next M/H frame. When reconfiguration occurs, wherein the mapping information between the ensemble within the current M/H frame and the mobile service differs from the ensemble within the next M/H frame and the mobile service, the M/H frame prior to reconfiguration is referred to as the current M/H frame, and the M/H frame following reconfiguration is referred to as the next M/H frame.

The transport_stream_id field corresponds to a 16-bit unsigned integer number field, which serves as a label for identifying the corresponding M/H broadcast. The value of the corresponding transport_stream_id field shall be equal to the value of the transport_stream_id field included in the program association table (PAT) within the MPEG-2 transport stream of a main ATSC broadcast.

The num_ensembles field corresponds to an 8-bit unsigned integer field, which indicates the number of M/H ensembles carried through the corresponding physical transmission channel.

FIG. 9 illustrates an exemplary syntax structure of an FIC chunk payload according to an embodiment of the present invention. For each ensemble corresponding to the num_ensembles field value within the FIC chunk header of FIG. 8, the FIC chunk payload includes configuration information of each ensemble and information on mobile services being transmitted through each ensemble.

The FIC chunk payload consists of an ensemble loop and a mobile service loop below the ensemble loop. The FIC chunk payload enables the receiver to determine through which ensemble a requested (or desired) mobile service is being transmitted. (This process is performed via mapping between the ensemble_id field and the M/H_service_id field.) Thus, the receiver may receive RS frames belonging to the corresponding ensemble.

In order to do so, the ensemble loop of the FIC chunk payload may include an ensemble_id field, an ensemble_protocol_version field, an SLT_ensemble_indicator field, a GAT_ensemble_indicator field, an MH_service_signaling_channel_version field, and a num_M/H_services field, which are collectively repeated as many times as the num_ensembles field value. The mobile service loop may include an MH_service_id field, a service_span field, an MH_service_status field, and an SP_indicator field, which are collectively repeated as many times as the num_M/H_services field.

The ensemble_id field corresponds to an 8-bit unsigned integer field, which indicates a unique identifier of the corresponding ensemble. For example, the ensemble_id field may be assigned with values within the range '0x00' to '0x7F'. The ensemble_id field group (or associate) the mobile services with the respective ensemble. Herein, it is preferable that the value of the ensemble_id field is derived from the parade_id field carried (or transmitted) through the TPC data.

If the corresponding ensemble is transmitted through a primary RS frame, the most significant bit is set to '0', and the remaining least significant bits are used as the parade_id field value of the corresponding parade. Meanwhile, if the corresponding ensemble is transmitted through a secondary RS frame, the most significant bit is set to '0', and the remaining least significant bits are used as the parade_id field value of the corresponding parade.

The ensemble_protocol_version field corresponds to a 5-bit field, which specifies a version of the corresponding ensemble structure. The SLT_ensemble_indicator field is a 1-bit field, which indicates whether or not the SLT is being transmitted to the service signaling channel of the corresponding ensemble. For example, when the SLT_ensemble_indicator field value is equal to '1', this may indicate that the SLT is being transmitted to the service signaling channel. On the other hand, when the SLT_ensemble_indicator field value is equal to '0', this may indicate that the SLT is not being transmitted.

The GAT_ensemble_indicator field is also a 1-bit field, which indicates whether or not the GAT is being transmitted to the service signaling channel of the corresponding ensemble. For example, when the GAT_ensemble_indicator field value is equal to '1', this may indicate that the GAT is being transmitted to the service signaling channel. On the other hand, when the GAT_ensemble_indicator field value is equal to '0', this may indicate that the GAT is not being transmitted. The MH_service_signaling_channel_version field corresponds to a 5-bit field, which indicates a version number of the service signaling channel of the corresponding ensemble.

The num_M/H_services field corresponds to an 8-bit unsigned integer field, which represents the number of mobile (i.e., M/H) services carried through the corresponding M/H ensemble.

For example, when the minor protocol version within the FIC chunk header is changed, and when an extension field is added to the ensemble loop header, the corresponding extension field is added immediately after the num_M/H services field. According to anther embodiment of the present invention, if the num_M/H_services field is included in the mobile service loop, the corresponding extension field that is to be added in the ensemble loop header is added immediately after the M/H_service_configuration_version field.

The M/H_service_id field of the mobile service loop corresponds to a 16-bit unsigned integer number, which identifies the corresponding M/H service. The value (or number) of the M/H_service_id field shall be unique within the mobile (M/H) broadcast. When an M/H service has components in multiple M/H ensembles, the set of IP streams corresponding to the service in each ensemble shall be treated as a separate service for signaling purposes, with the exception that the entries for the corresponding services in the FIC shall all have the same M/H_service_id field value. Thus, the same M/H_service_id field value may appear in more than one num_ensembles loop. And, accordingly, the M/H_service_id field shall represent the overall combined service, thereby maintaining the uniqueness of the M/H_service_id field value.

The service_span field is a two-bit enumerated field, which corresponds to one of the SNI information according to the present invention. The service_span field indicates whether the corresponding M/H service is transmitted through (or over) one ensemble, or whether the corresponding M/H service is transmitted through (or over) multiple ensembles. Also, the value of the service_span field indicates whether or not the mobile service is valid (or rendered meaningfully)

only for the mobile service portion being transmitted through (or over) the corresponding ensemble.

FIG. 10 illustrates an exemplary significance defined in a value of the service_span field according to the present invention. For example, when the service_span field value is equal to '00', this indicates that the corresponding mobile service is being transmitted through a single ensemble. And, when the service_span field value is equal to '01' or '10', this indicates that the corresponding mobile service is being transmitted through multiple ensembles. At this point, when the service_span field value is equal to '01', this indicates that the corresponding mobile service is being transmitted through multiple ensembles, and that service rendering is available even with the component of the current ensemble only. Also, when the service_span field value is equal to '10', this indicates that the corresponding mobile service is being transmitted through multiple ensembles, and that service rendering is only available when the component of the current ensemble and the component of another ensemble are present.

For example, when a mobile service A includes 3 components (e.g., a1, a2, and a3), and when it is assumed that components a1 and a2 are transmitted through ensemble 1 and that component a3 is transmitted through ensemble 2, the value of the service_span field is marked as '01' or '10'. At this point, when it is assumed that mobile service A can be rendered even with components a1 and a2 only, the service_span field value corresponding to mobile service A of ensemble 1 is marked as '01', and the service_span field value corresponding to mobile service A of ensemble 2 is marked as '10'. At this point, even when only components a1 and a2 are decoded, a meaningful service may be provided to the user.

As a possible example of this case, component a1 corresponds to a basic layer video stream of mobile service A, component a2 corresponds to an audio stream of mobile service A, and component a3 corresponds to an enhanced layer video stream of mobile service A. However, when it is assumed that service rendering of mobile service A is only available when components a1, a2, and a3 are all present, the service_span field values corresponding to mobile service A of ensemble 1 and ensemble 2 are both marked as '10'. At this point, even if any one of the components a1, a2, and a3 is omitted, a meaningful service cannot be provided to the user.

As another example, it is assumed that two types of ensemble information (i.e., ensemble 1 and ensemble 2) are transmitted through a single FIC chunk, and that two mobile services 30-2 and 30-3 are transmitted through ensemble 1, and that two mobile services 30-2 and 30-4 are transmitted through ensemble 2. In other words, as described above, mobile service 30-2 is transmitted through two ensembles ensemble 1 and ensemble 2.

Figure 11:
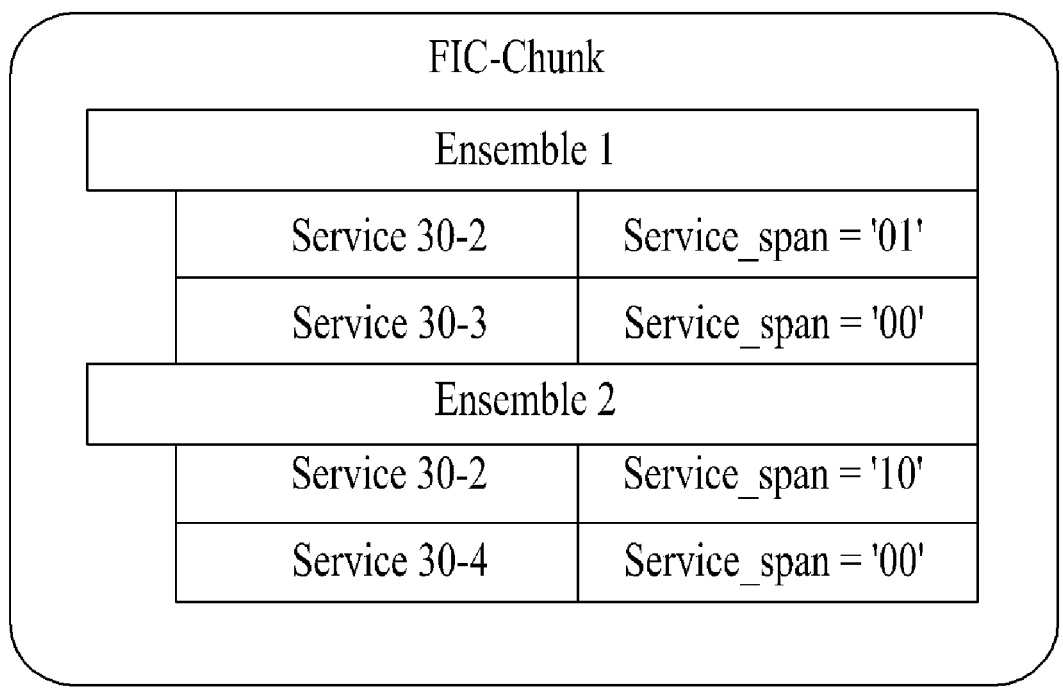
FIG. 11 illustrates an exemplary structure of an FIC chunk according to the value of the service_span field of FIG. 10.

Furthermore, it is assumed that an ensemble and a service entry of the FIC chunk payload are configured as shown in FIG. 11. Referring to FIG. 11, the service_span field value of mobile service 30-2 in an ensemble 1 loop is set to be equal to '01', and the service_span field value of mobile service 30-3 is set to be equal to '00'. And, the service_span field value of mobile service 30-2 in an ensemble 2 loop is set to be equal to '10', and the service_span field value of mobile service 30-4 is set to be equal to '00'. More specifically, as shown in FIG. 11, the FIC chunk carries an entry for the mobile service 30-2 in the ensemble 1 loop and the ensemble 2 loop. Also, it is apparent that the components of mobile service 30-2 being transmitted through ensemble 2 are dependent to the components of mobile service 30-2 being transmitted through ensemble 1.

In the above-described example, the receiving system receives the FIC chunk. Then, in case the requested (or desired) mobile service is mobile service 30-2, ensemble 1 and ensemble 2 are used to set-up the VNI. In case the requested mobile service is mobile service 30-3, the VNI is set-up only with ensemble 1. And, in case the requested mobile service is mobile service 30-4, the VNI is set-up only with ensemble 2. At this point, in order to receive all components of mobile service 30-2, two RS frame decoders are required. If the receiving system is provided with only one RS frame decoder, in case of mobile service 30-2, service rendering can be provided only for the components being transmitted through ensemble 1 according to service_span field value.

The M/H_service_status field corresponds to a 2-bit enumerated field, which identifies the status of the corresponding M/H service. For example, the most significant bit of the M/H_service_status field indicates whether the corresponding M/H service is active (when set to '1') or inactive (when set to '0'). Furthermore, the least significant bit indicates whether the corresponding M/H service is hidden (when set to '1') or not (when set to '0'). The SP_indicator field corresponds to a 1-bit field, which, when set to '1', indicates whether or not service protection is applied to at least one of the components required for providing a significant presentation of the corresponding M/H service.

For example, when the minor protocol version of the FIC chunk is change, and if an expansion field is added to the mobile service loop, the expansion field is added after the SP_indicator field.

Also, the FIC chunk payload may include an FIC_chunk_stuffing( ) field. Stuffing of the FIC_chunk_stuffing( ) field may exist in an FIC-Chunk, to keep the boundary of the FIC-Chunk to be aligned with the boundary of the last FIC-Segment among FIC segments belonging to the FIC chunk. The length of the stuffing is determined by how much space is left after parsing through the entire FIC-Chunk payload preceding the stuffing.

At this point, the transmitting system (not shown) according to the present invention divides the FIC chunk into multiple FIC segments, thereby outputting the divided FIC segments to the receiving system in FIC segment units. The size of each FIC segment unit is 37 bytes, and each FIC segment consists of a 2-byte FIC segment header and a 35-byte FIC segment payload. More specifically, an FIC chunk, which is configured of an FIC chunk header and an FIC chunk payload, is segmented by units of 35 bytes. Also, an FIC segment is configured by adding a 2-byte FIC segment header in front of each segmented 35-byte unit.

According to an embodiment of the present invention, the length of the FIC chunk payload is variable. Herein, the length of the FIC chunk varies depending upon the number of ensembles being transmitted through the corresponding physical transmission channel and the number of mobile services included in each ensemble.

Also, the FIC chunk payload may include stuffing data. In this case, the stuffing data are used for the boundary alignment of the FIC chunk and the last FIC-Segment, among FIC segments belonging to the FIC chunk, according to the embodiment of the present invention. Accordingly, by minimizing the length of the stuffing data, unnecessary wasting of FIC segments can be reduced.

At this point, the number of stuffing data bytes being inserted in the FIC chunk can be calculated by using Equation 1 below.

$$\text{The number of stuffing data bytes} = 35 - j \quad \text{Equation 1}$$

j=(5+the number of signaling data bytes being inserted in the FIC chunk payload) mod 35

For example, when the added total length of the 5-byte header within the FIC chunk and signaling data, which is to be inserted in the payload within the FIC chunk, is equal to 205 bytes, the payload of the FIC chunk may include 5 bytes of stuffing data because j is equal to 30 in Equation 1. Also, the length of the FIC chunk payload including the stuffing data is equal to 210 bytes. Thereafter, the FIC chunk is divided into 6 FIC segments, which are then transmitted. At this point, a segment number is sequentially assigned to each of the 6 FIC segments divided from the FIC chunk.

Furthermore, the present invention may transmit the FIC segments divided from a single FIC chunk to a single sub-frame, or may transmit the divided FIC segments to multiple sub-frames. If the FIC chunk is divided and transmitted to multiple sub-frames, signaling data, which are required even when the amount of data that are to be transmitted through the FIC chunk is larger than the amount of FIC segments being transmitted through a single sub-frame (this case corresponds to when multiple services having very low bit rates are being executed), may all be transmitted through the FIC chunk.

Herein, the FIC segment numbers represent FIC segment numbers within each FIC chunk, and not the FIC segment number within each sub-frame. Thus, the subordinate relation between the FIC chunk and the sub-frame can be eliminated, thereby reducing excessive waste of FIC segments.

Furthermore, the present invention may add a null FIC segment. Despite the repeated transmission of the FIC chunk, and when stuffing is required in the corresponding M/H frame, the null FIC segment is used for the purpose of processing the remaining FIC segments. For example, it is assumed that TNoG is equal to '3' and that the FIC chunk is divided into 2 FIC segments. Herein, when the FIC chunk is repeatedly transmitted through 5 sub-frames within a single M/H frame, only 2 FIC segments are transmitted through one of the 5 sub-frames (e.g., the sub-frame chronologically placed in the last order). In this case, one null FIC segment is assigned to the corresponding sub-frame, thereby being transmitted. More specifically, the null FIC segment is used for aligning the boundary of the FIC chunk and the boundary of the M/H frame. At this point, since the null FIC segment is not an FIC segment divided from the FIC chunk, an FIC segment number is not assigned to the null FIC segment.

In the present invention, when a single FIC chunk is divided into a plurality of FIC segments, and when the divided FIC segments are included in each data group of at least one sub-frame within the M/H frame, so as to be transmitted, the corresponding FIC segments are allocated in a reversed order starting from the last sub-frame within the corresponding M/H frame. According to an embodiment of the present invention, in case a null FIC segment exists, the null FIC segment is positioned in the sub-frame within the M/H frame, so that the corresponding null FIC segment can be transmitted as the last (or final) segment.

At this point, in order to enable the receiving system to discard the null FIC segment without having to process the corresponding null FIC segment, identification information that can identify (or distinguish) the null FIC segment is required.

According to an embodiment of the present invention, the present invention uses the FIC_segment_type field within the header of the null FIC segment as the identification information for identifying the null FIC segment. In this embodiment, the value of the FIC_segment_type field within the null FIC segment header is set to '11', so as to identify the corresponding null FIC segment. More specifically, when the FIC_segment_type field value within the null FIC segment header is set to '11' and transmitted to the receiving system, the receiving system may discard the payload of the FIC segment having the FIC_segment_type field value set to '11' without having to process the corresponding FIC segment payload. Herein, the value '11' is merely an exemplary value given to facilitate and simplify the understanding of the present invention. As long as a pre-arrangement between the receiving system and the transmitting system is established, any value that can identify the null FIC segment may be given to the FIC_segment_type field. Therefore, the present invention will not be limited only to the example set presented herein. Furthermore, the identification information that can identify the null FIC segment may also be indicated by using another field within the FIC segment header.

FIG. 12 illustrates an exemplary syntax structure of an FIC segment header according to an embodiment of the present invention. Herein, the FIC segment header may include an FIC_segment_type field, an FIC_chunk_major_protocol_version field, a current_next_indicator field, an error_indicator field, an FIC_segment_num field, and an FIC_last_segment_num field. Each field will now be described as follows.

The FIC_segment_type field corresponds to a 2-bit field, which, when set to '00' indicates that the corresponding FIC segment is carrying a portion of an FIC chunk. Alternatively, when the FIC_segment_type field is set to '11', the FIC_segment_type field indicates that the corresponding FIC segment is a null FIC segment, which transmits stuffing data. Herein, the remaining values are reserved for future use.

The FIC_Chunk_major_protocol_version field corresponds to a 2-bit field, which indicates a major protocol version of the corresponding FIC chunk. At this point, the value of the FIC_Chunk_major_protocol_version field should be the same as the value of the FIC_major_protocol_version field within the corresponding FIC chunk header. Since reference may be made to the description of the FIC chunk header shown in FIG. 8, a detailed description of the major protocol version of the FIC chunk syntax will be omitted for simplicity.

The current_next_indicator field corresponds to a 1-bit indicator, which, when set to '1', shall indicate that the corresponding FIC segment is carrying a portion of the FIC chunk, which is applicable to the current M/H frame. Alternatively, when the value of the current_next_indicator field is set to '0', the current_next_indicator field shall indicate that the corresponding FIC segment is carrying a portion of the FIC chunk, which will be applicable for the next M/H frame.

The error_indicator field corresponds to a 1-bit field, which indicates whether or not an error has occurred in the corresponding FIC segment during transmission. Herein, the error_indicator field is set to '1', when an error has occurred. And, the error_indicator field is set to '0', when an error does not exist (or has not occurred). More specifically, during the process of configuring the FIC segment, when a non-recovered error exists, the error_indicator field is set to '1'. More specifically, the error_indicator field enables the receiving system to recognize the existence (or presence) of an error within the corresponding FIC segment.

The FIC_segment_num field corresponds to a 4-bit unsigned integer number field, which indicates a number of the corresponding FIC segment. For example, if the corresponding FIC segment is the first FIC segment of the FIC chunk, the value of the FIC_segment_num field shall be set to '0x0'. Also, if the corresponding FIC segment is the second FIC segment of the FIC chunk, the value of the FIC_segment_num field shall be set to '0x1'. More specifically, the FIC_segment_num field shall be incremented by one with each additional FIC segment in the FIC chunk.

Herein, if the FIC chunk is divided into 4 FIC segments, the FIC_segment_num field value of the last FIC segment within the FIC chunk will be indicated as '0x3'.

The FIC_last_segment_num field corresponds to a 4-bit unsigned integer number field, which indicates the number of the last FIC segment (i.e., the FIC segment having the highest FIC_segment_num field value) within a complete FIC chunk.

In the conventional method, FIC segment numbers are sequentially assigned (or allocated) for each FIC segment within one sub-frame. Therefore, in this case, the last FIC segment number always matches with the TNoG (i.e., the last FIC segment number is always equal to the TNoG). However, when using the FIC number assignment method according to the present invention, the last FIC segment number may not always match with the TNoG. More specifically, the last FIC segment number may match with the TNoG, or the last FIC segment number may not match with the TNoG. The TNoG represents a total number of data groups that are allocated (or assigned) to a single sub-frame. For example, when the TNoG is equal to '6', and when the FIC chunk is divided into 8 FIC segments, the TNoG is equal to '6', and the last FIC segment number is '8'.

According to another embodiment of the present invention, the null FIC segment may be identified by using the value of the FIC_segment_num field within the FIC segment header. More specifically, since an FIC segment number is not assigned to the null FIC segment, the transmitting system allocates null data to the FIC_segment_num field value of the null FIC segment, and the receiving system may allow the FIC segment having null data assigned to the FIC_segment_num field value to be recognized as the null FIC segment. Herein, instead of the null data, data pre-arranged by the receiving system and the transmitting system may be assigned to the FIC_segment_num field value, instead of the null data.

As described above, the FIC chunk is divided into a plurality of FIC segments, thereby being transmitted through a single sub-frame or being transmitted through multiple sub-frames. Also, FIC segments divided from a single FIC chunk may be transmitted through a single sub-frame, or FIC segments divided from multiple single FIC chunks may be transmitted through a single sub-frame. At this point, the number assigned to each FIC segment corresponds to a number within the corresponding FIC chunk (i.e., the FIC_seg_number value), and not the number within the corresponding sub-frame. Also, the null FIC segment may be transmitted for aligning the boundary of the M/H frame and the boundary of the FIC chunk. At this point, an FIC segment number is not assigned to the null FIC segment.

As described above, one FIC chunk may be transmitted through multiple sub-frames, or multiple FIC chunks may be transmitted through a single sub-frame. However, according to the embodiment of the present invention, the FIC segments are interleaved and transmitted in sub-frame units.

Meanwhile, FIG. 13 illustrates another exemplary syntax structure of an FIC chunk payload according to the present invention. FIG. 13 further includes a VNI_ID field in the ensemble loop. Apart from the VNI_ID field and the absence of the service_span field in the mobile service loop, the rest of the field configuration and significance is identical to the syntax structure shown in FIG. 9. Therefore, apart from the VNI_ID field, since reference may be made to FIG. 9, detailed description of the remaining fields will be omitted in FIG. 13 for simplicity. Herein, the VNI_ID field also corresponds to one of the VNI information according to the present invention, and the VNI_ID is assigned to each ensemble.

More specifically, the VNI_ID field corresponds to an 8-bit, which indicates the ID value of the VNI to which each ensemble belongs. Essentially, the VNI_ID field value forms a one-to-one (1:1) correspondence mapping with the ensemble_id field value. However, a one-to-N (1:N) correspondence mapping is also possible. For example, it is assumed that two types of ensemble information (i.e., ensemble 1 and ensemble 2) are transmitted through a single FIC chunk, and that two mobile services 30-2 and 30-3 are transmitted through ensemble 1, and that two mobile services 30-2 and 30-4 are transmitted through ensemble 2. In other words, as described above, mobile service 30-2 is transmitted through two ensembles ensemble 1 and ensemble 2. In this case, the VNI_ID field value of ensemble 1 loop and the VNI_ID field value of ensemble 2 loop within the FIC chunk are identical to one another.

In the above-described example, the receiving system receives the FIC chunk. Then, in case the requested (or desired) mobile service is mobile service 30-2, ensemble 1 and ensemble 2 set-up the VNI. In case the requested mobile service is mobile service 30-3, the VNI is set-up only with ensemble 1. And, in case the requested mobile service is mobile service 30-4, the VNI is set-up only with ensemble 2. At this point, in order to receive all components of mobile service 30-2, two RS frame decoders are required. If the receiving system is provided with only one RS frame decoder, in case of mobile service 30-2, reference is made to the essential_component_indicator field within the SMT, thereby service-rendering only the components indicated as essential components.

Meanwhile, FIG. 14 illustrates an exemplary structure of a bit stream syntax of an SMT section which is included in the RS frame and then transmitted. Herein, the SMT section is configured in an MPEG-2 private section format for simplicity. However, the SMT section data may be configured in any possible format.

The SMT may provide access information of mobile services within an ensemble including the SMT. Also, the SMT may provide information required for the rendering of mobile services. Furthermore, the SMT may include at least one or more descriptors. Herein, other additional (or supplementary) information may be described by the descriptor.

At this point, the service signaling channel that transmits the SMT may further include another signaling table (e.g., GAT) in addition to the SMT.

Herein, according to the embodiment of the present invention, IP datagrams of the service signaling channel have the same well-known destination IP address and the same well-known destination UDP port number. Therefore, the SMT included in the service signaling data is distinguished (or identified) by a table identifier. More specifically, the table identifier may correspond to a table_id existing in the corresponding table or in a header of the corresponding table section. And, when required, the table identifier may further refer to a table_id_extension field, so as to perform the identification process. Exemplary fields that can be transmitted through the SMT section will now be described in detail.

A table_id field is an 8-bit table identifier, which may be set up as an identifier for identifying the SMT. A section_syntax_indicator field corresponds to an indicator defining the section format of the SMT. For example, the section_syntax_indicator field shall be set to '0' to always indicate that this table is derived from the "short" form of the MPEG-2 private section table format may correspond to MPEG long_form syntax. A private_indicator field is a 1-bit field, which indicates whether or not the SMT follows (or is in accordance with) a private section.

A section_length field is a 12-bit field, which specifies the section length of the remaining SMT data bytes immediately following the section_length field. A table_id_extension field corresponds to a table-dependent 16-bit field. Herein, the table_id_extension field corresponds to a logical portion of the table_id field providing the scope for the remaining fields. The table_id_extension field includes a SMT_protocol_version field and an ensemble_id field. The SMT_protocol_version field corresponds to an 8-bit unsigned integer field. Herein, the SMT_protocol_version field indicates a protocol version for allowing the corresponding SMT to carry, in a future process, parameters that may be structure differently from those defined in the current protocol. Presently, the value of the SMT_protocol_version field shall be equal to zero (0). Non-zero values of the SMT_protocol_version field may be used by a future version of this standard to indicate structurally different tables.

An ensemble_id field corresponds to an 8-bit field. Herein, the ID values associated with the corresponding ensemble that can be assigned to the ensemble_id field may range from '0x00' and '0x3F'. It is preferable that the value of the ensemble_id field is derived from the TPC data of the parade_id field. When the corresponding ensemble is transmitted through a primary RS frame, the most significant bit (MSB) is set to '0', and the remaining 7 bits are used as the parade_id field value of the corresponding parade. Meanwhile, when the corresponding ensemble is transmitted through a primary RS frame, the most significant bit (MSB) is set to '1', and the remaining 7 bits are used as the parade_id field value of the corresponding parade.

A version_number field corresponds to a 5-bit field, which specifies the version number of the SMT. A current_next_indicator field corresponds to a 1-bit field indicating whether or not the SMT section is currently applicable. A section_number field is an 8-bit field specifying the number of the current SMT section. A last_section_number field corresponds to an 8-bit field that specifies the number of the last section configuring the corresponding SMT.

And, a num_MH_services field corresponds to an 8-bit field, which specifies the number of mobile services in the corresponding SMT section. Hereinafter, a number of 'for' loop statements equivalent to the number of mobile services corresponding to the num_MH_services field is performed so as to provide signaling information on multiple mobile services. More specifically, signaling information of the corresponding mobile service is indicated for each mobile service that is included in the SMT section. Herein, the following field information corresponding to each mobile service may be provided as described below.

An MH_service_id field corresponds to a 16-bit unsigned integer number, which can uniquely identify the corresponding mobile service within the scope of the corresponding SMT section.

The service_span field corresponds to a 2-bit field, which indicates whether the corresponding mobile service is transmitted through one or more ensembles. Since the service_span field has the same meaning as the service_span field included in the FIC chunk, detailed description of the same will be omitted for simplicity.

An MH_service_status field corresponds to a 2-bit field, which can identify the status of the corresponding mobile service. Herein, the MSB indicates whether the corresponding mobile service is active ('1') or whether the corresponding mobile service is inactive ('0'). Also, the LSB indicates whether the corresponding mobile service is hidden ('1') or not hidden ('0').

An SP_indicator field corresponds to a 1-bit field, which specifies service protection status of the corresponding mobile service. If the SP_indicator field is set to '1', then service protection is applied to at least one of the components needed to provide a meaningful presentation of the corresponding service. A short_MH_service_name_length field corresponds to a 3-bit field, which indicates the length of a short service name described in a short_service_name field in byte-length units. The short_MH_service_name field indicates the short name of the corresponding mobile service. An MH_service_category field is a 6-bit field, which identifies the type category of the corresponding mobile service.

A num_components field corresponds to a 5-bit field, which specifies the number of IP stream components in the corresponding mobile service.

An IP_version_flag field corresponds to a 1-bit indicator, which when set to '0' indicates that a source_IP_address field, an MH_service_destination_IP_address field, and a component_destination_IP_address field correspond to IPv4 addresses. The value of '1' for the IP_version_flag field is reserved for any possible future indication that the source_IP_address field, the MH_service_destination_IP_address field, and the component_destination_IP_address field correspond to IPv6 addresses. However, the usage of IPv6 addressing is currently undefined.

A source_IP_address_flag corresponds to a 1-bit Boolean flag, which indicates, when set, that a source IP address value for the corresponding service exists (or is present) so as to indicate a source specific multicast. An MH_service_destination_IP_address_flag corresponds to a 1-bit, which indicates, when set, that the corresponding IP stream component is transmitted through an IP datagram having a destination IP address different from that of the MH_service_destination_IP_address field. Therefore, when the MH_service_destination_IP_address_flag is set, the receiving system may use the component_destination_IP_address as the destination_IP_address in order to access the corresponding IP stream component. Furthermore, the receiving system ignores (or disregards) the MH_service_destination_IP_address field within the num_MH_services loop.

The source_IP_address field corresponds to a 32-bit field or a 128-bit field. When the source_IP_address_flag is set to '1', the source_IP_address field is required to be interpreted (or analyzed). However, when the source_IP_address_flag is set to '0', the source_IP_address field is not required to be interpreted (or analyzed). When the source_IP_address_flag is set to '1', and when the IP_version_flag field is set to '0', the corresponding field indicates that the source_IP_address field indicates a 32-bit IPv4 address specifying the corresponding mobile service source. Alternatively, if the IP_version_flag field is set to '1', the source_IP_address field indicates a 32-bit IPv6 address specifying the corresponding mobile service source.

The MH_service_destination_IP_address field corresponds to a 32-bit field or a 128-bit field. When the MH_service destination_IP_address_flag field is set to '1', the MH_service_destination_IP_address_flag is required to be interpreted (or analyzed). However, when the MH_service_destination_IP_address_flag is set to '0', the MH_service_destination_IP_address_flag is not required to be interpreted (or analyzed). Herein, if the MH_service_destination_IP_address_flag is set to '1', and if the IP_version_flag field is set to '0', the MH_service_destination_IP_address field indicates a 32-bit destination IPv4 address for the corresponding mobile service.

Alternatively, if the MH_service_destination_IP_address_flag is set to '1', and if the IP_version_flag field is set to '1', the MH_service_destination_IP_address field indicates a 64-bit destination IPv6 address for the corresponding mobile service. In case the corresponding MH_service_destination_IP_address field cannot be interpreted, the component_destination_IP_address field within the num_components loop shall be interpreted. And, in this case, the receiving system shall use the component_destination_IP_address in order to access the IP stream component.

Meanwhile, the SMT according to the embodiment of the present invention provides information on multiple components using the 'for' loop statement. Hereinafter, a number of 'for' loop statements (or component loops) equivalent to the number of components corresponding to the num_component field value is performed so as to provide access information on multiple components. More specifically, access information of each component included in the corresponding mobile service is provided. In this case, the following field information on each component may be provided as described below.

The essential_component_indicator field is a 1-bit field, which indicates that the corresponding component is an essential component for the mobile service, when the essential_component_indicator field value is set to '1'. Otherwise, the essential_component_indicator field indicates that the corresponding component is an optional component. For example, in case of a basic layer audio stream and video stream, the essential_component_indicator field value is set to '1'. And, in case of the enhanced layer video stream, the essential_component_indicator field value is set to '0'.

A component_destination_IP_address_flag field corresponds to a 1-bit Boolean flag. When the component_destination_IP_address_flag field is set to '1', this indicates that a component_destination_IP_address exists for the corresponding component. A port_num_count field corresponds to a 6-bit field, which indicates a UDP port number associated with the corresponding UDP/IP stream component. Herein, the destination UDP Port number value is increased by 1 starting from a destination_UDP_port_num field value. The destination_UDP_port_num field corresponds to a 16-bit field, which indicates a destination UDP port number for the corresponding IP stream component.

A component_destination_IP_address field corresponds to a 32-bit field or a 128-bit field. When the IP_version_flag field is set to '0', the component_destination_IP_address field indicates a 32-bit destination IPv4 address for the corresponding IP stream component. Furthermore, when the IP_version_flag field is set to '1', the component_destination_IP_address field indicates a 128-bit destination IPv6 address for the corresponding IP stream component. When this field is present, the destination address of the IP datagrams carrying the corresponding component of the M/H service shall match the address in the component_destination_IP_address field. Alternatively, when this field is not present, the destination address of the IP datagrams carrying the corresponding component shall match the address in the M/H_service_destination_IP_address field. The conditional use of the 128 bit-long address version of this field is to facilitate possible future usage of the IPv6, although the usage of the IPv6 is currently undefined.

A num_component_level_descriptors field corresponds to a 4-bit field, indicating a number of descriptors providing additional information on the component level. A number of component_level_descriptor( ) corresponding to the value of the num_component_level_descriptors field is included in the component loop, so as to provide additional (or supplemental) information on the corresponding component. A num_MH_service_level_descriptors field corresponds to a 4-bit field indicating a number of descriptors providing additional information of the corresponding mobile service level.

A number of service_level_descriptor( ) corresponding to the value of the num_MH_service_level_descriptors field is included in the mobile service loop, so as to provide additional (or supplemental) information on the mobile service. A num_ensemble_level_descriptors field corresponds to a 4-bit field, which indicates a number of descriptors providing additional information on ensemble levels. Furthermore, a number of ensemble_level_descriptor( ) corresponding to the value of the num_ensemble_level_descriptors field is included in the ensemble loop, so as to provide additional (or supplemental) information on the ensemble.

Figure 15:
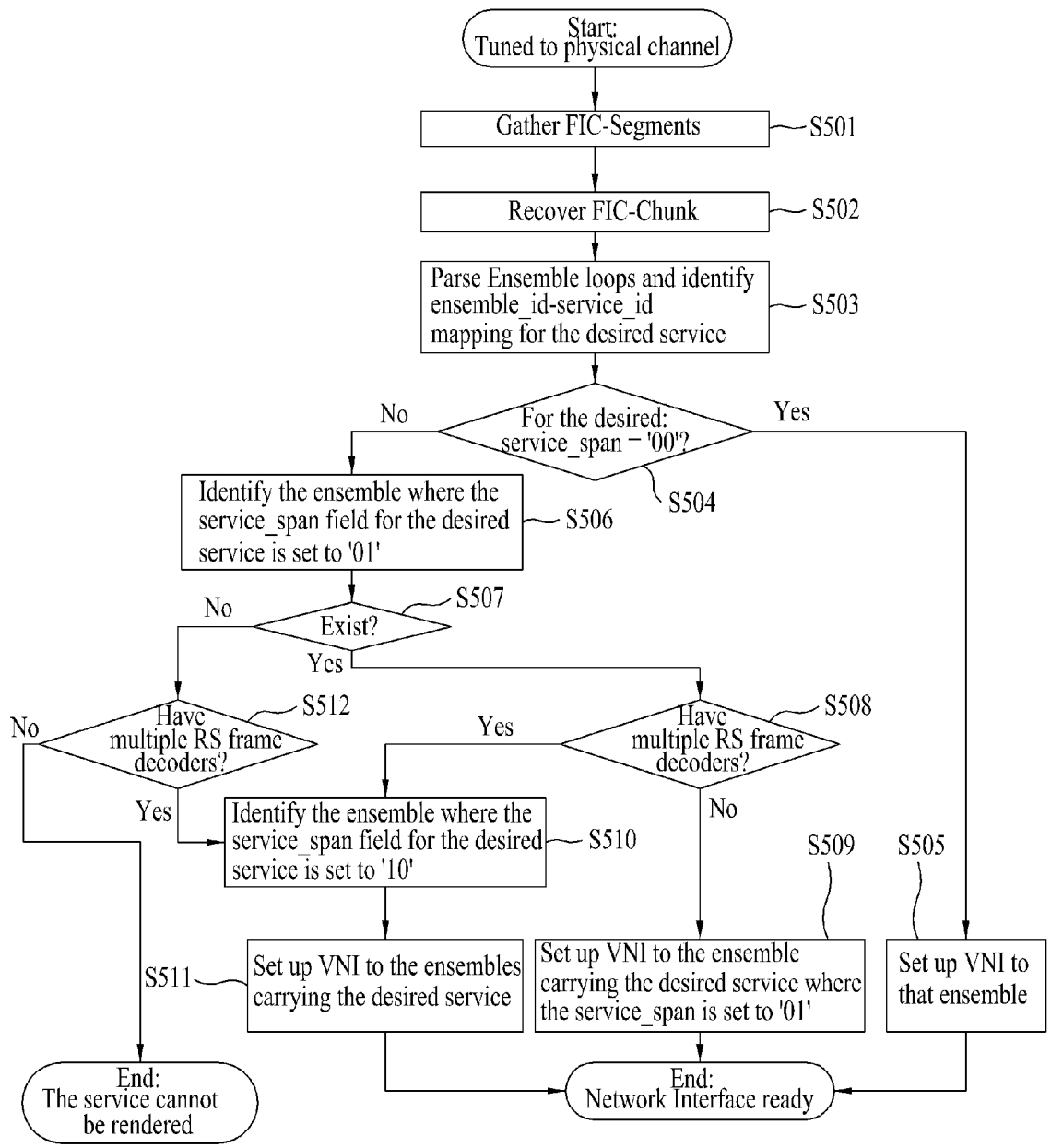
FIG. 15 illustrates a flow chart for setting-up a VNI using the service_span field of FIG. 9.

FIG. 15 illustrates a flow chart for setting-up a VNI using the service_span field of FIG. 9.

More specifically, when a physical transmission channel including a user-selected mobile service is tuned, a mobile broadcast signal (i.e., M/H signal) transmitting the user-selected mobile service is identified from the tuned physical transmission channel. Then, the receiving system finds out the number of a subframe to which the identified mobile broadcast signal is transmitted and the number of a slot that is assigned to the subframe. Thereafter, the receiving system gathers data groups that are received through the slots of the found subframe. Subsequently, the receiving system performs PCCC decoding on the FIC data being received in each signaling information region of the gathered data groups. Then, after performing deinterleaving in subframe units on the decoded FIC data, the receiving system performs RS decoding on the deinterleaved data as an inverse process of the transmitting system. Afterwards, the receiving system gathers FIC segments in subframe units, or M/H frame units (S501). Then, the receiving system analyses the header of each FIC segment and recovers an FIC chunk from the payloads of multiple FIC segments (S502).

At this point, the FIC chunk consists of an FIC chunk header and an FIC chunk payload. Herein, it is assumed that the syntax structure of the FIC chunk header is the same as the syntax structure shown in FIG. 8, and it is also assumed that the syntax structure that of the FIC chunk payload is the same as the syntax structure shown in FIG. 9.

Then, when the FIC chunk is recovered in step 502, the receiving system parses the ensemble loop and the mobile service loop of the FIC chunk payload, so as to verify the mapping of the ensemble identifier (ensemble_id) and the service identifier (service_id) transmitting the requested mobile service (S503). Subsequently, the receiving system verifies whether the value of the service_span field within the mobile service loop, which includes the verified service identifier (service_id), is equal to '00' (S504).

When the service_span field value is equal to '00', this indicates that the requested mobile service is transmitted through a single ensemble. In this case, an ensemble transmitting the requested mobile service is set as the VNI (S505). In other words, the receiving system renders only the components being transmitted through ensemble 1.

Alternatively, when the service_span field value is not equal to '00', this indicates that the requested mobile service is transmitted through multiple ensembles. In this case, depending upon the service_span field value and the number of RS frame decoders within the receiving system, the components of the requested mobile service may be received and processed from all ensembles transmitting the reception-requested mobile service. Or, the components of the requested mobile service may be received and processed from some of the ensembles transmitting the reception-requested mobile service.

In order to do so, the receiving system finds an ensemble having the service_span field value of '01' among the multiple ensembles transmitting the reception-requested mobile service (S506). If an ensemble having the service_span field value of '01' exists (S507), the receiving system verifies whether or not a plurality of RS frame decoders is provided therein (S508). Then, when it is determined that only one RS frame decoder is provided in the receiving system, only the ensemble having the service_span field value of '01' is used to set-up the VNI (S509).

On the other hand, when it is determined that a plurality of RS frame decoders is provided in the receiving system, the receiving system verifies an ensemble having the service_span field value of '10' among the multiple ensembles transmitting the reception-requested mobile service (S510). Subsequently, the receiving system sets-up the VNI with the ensemble having the service_span field value of '01' found in step 507 and at least one ensemble having the service_span field value of '10' found in step 510 (S511). For example, when the receiving system provided with 2 RS frame decoders, the ensemble having the service_span field value of '01' found in step 507 and the ensemble having the service_span field value of '10' found in step 510, i.e., 2 ensembles, set-up the VNI.

For example, it is assumed that two types of ensemble information (i.e., ensemble 1 and ensemble 2) are transmitted through the recovered FIC chunk, and that two mobile services 30-2 and 30-3 are transmitted through ensemble 1, and that two mobile services 30-2 and 30-4 are transmitted through ensemble 2. Additionally, it is assumed that an ensemble and a service entry of the FIC chunk payload are configured as shown in FIG. 11. Referring to FIG. 11, the service_span field value of mobile service 30-2 is set to be equal to '01', and the service_span field value of mobile service 30-3 is set to be equal to '00' in an ensemble 1 loop. Also, the service_span field value of mobile service 30-2 is set to be equal to '10', and the service_span field value of mobile service 30-4 is set to be equal to '00' in an ensemble 2 loop.

In the above-described example, the receiving system recovers the FIC chunk. Then, in case the requested (or desired) mobile service is mobile service 30-2, and when 2 RS frame decoders are provided in the receiving system, ensemble 1 and ensemble 2 are set-up the VNI. However, in case the requested mobile service is mobile service 30-2, and when one RS frame decoder is provided in the receiving system, the VNI is set-up only with ensemble 1.

Meanwhile, when an ensemble having the service_span value of '01' does not exist among multiple ensembles transmitting the reception-requested (or desired) mobile service, the receiving system verifies whether or not a plurality of RS frame decoders is provided therein (S512). If the receiving system is provided with only one RS frame decoder, the receiving system cannot render the desired mobile service. However, if the receiving system is provided with a plurality of RS frame decoders, the receiving system verifies an ensemble having the service_span field value of '10' among the multiple ensembles transmitting the desired mobile service (S510). Thereafter, the VNI is set-up with at least one ensemble having the service_span field value of '10', as verified in step 510 (S511).

Figure 16:
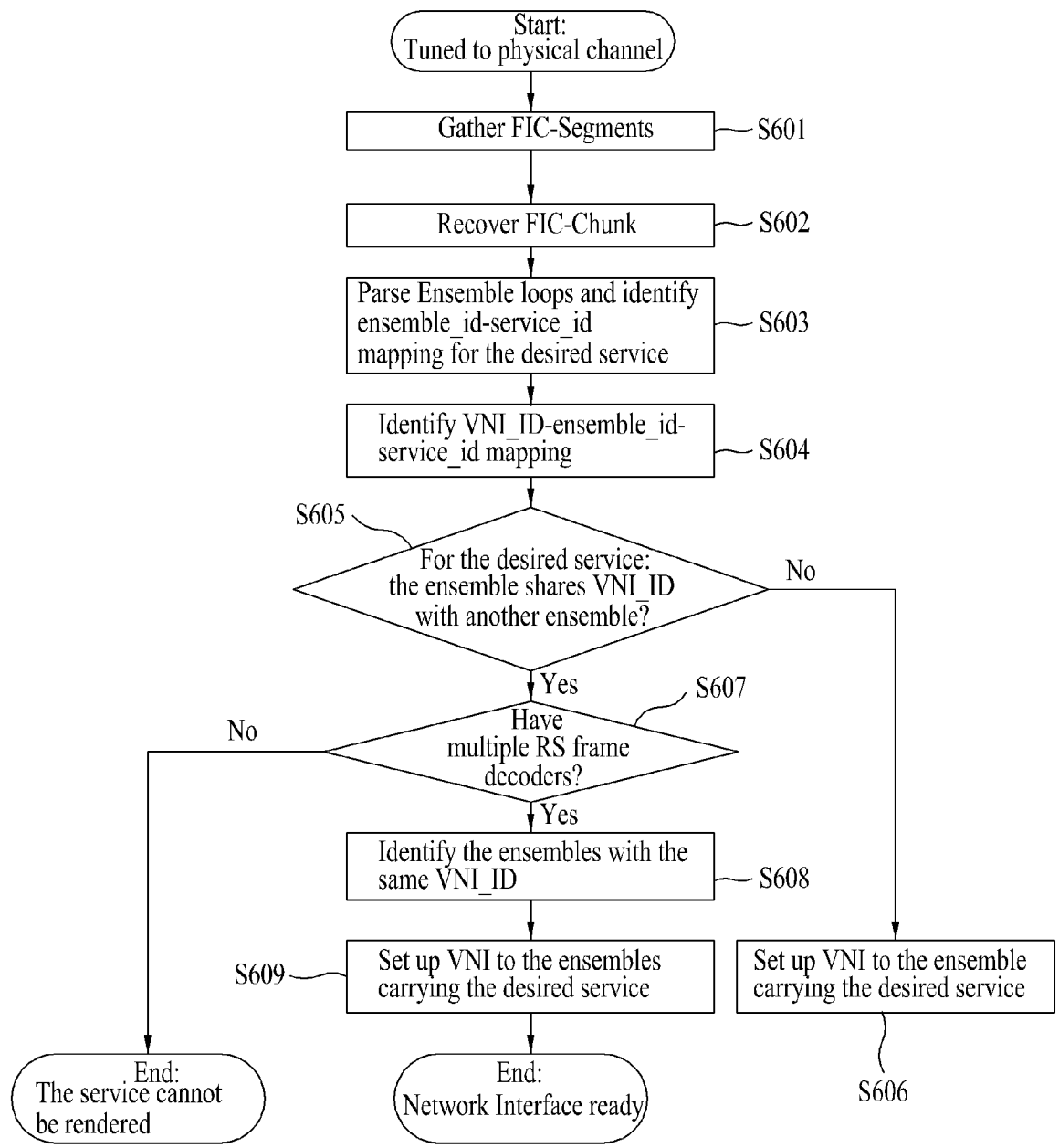
FIG. 16 illustrates a flow chart for setting-up a VNI using the VNI_ID field of FIG. 13.

FIG. 16 illustrates a flow chart for setting-up a VNI using the VNI_ID field of FIG. 13. More specifically, when a physical transmission channel including a user-selected mobile service is tuned, a mobile broadcast signal (i.e., M/H signal) transmitting the user-selected mobile service is identified from the tuned physical transmission channel. Then, the receiving system finds out the number of a subframe to which the identified mobile broadcast signal is transmitted and the number of a slot that is assigned to the subframe. Thereafter, the receiving system gathers data groups that are received through the slots of the found subframe. Subsequently, the receiving system performs PCCC decoding on the FIC data being received in each signaling information region of the gathered data groups. Then, after performing deinterleaving in subframe units on the decoded FIC data, the receiving system performs RS decoding on the deinterleaved data as an inverse process of the transmitting system. Afterwards, the receiving system gathers FIC segments in subframe units, or M/H frame units (S601). Then, the receiving system analyses the header of each FIC segment and recovers an FIC chunk from the payloads of multiple FIC segments (S602).

At this point, the FIC chunk consists of an FIC chunk header and an FIC chunk payload. Herein, it is assumed that the syntax structure of the FIC chunk header is the same as the syntax structure shown in FIG. 8, and it is also assumed that the syntax structure that of the FIC chunk payload is the same as the syntax structure shown in FIG. 13. Then, when the FIC chunk is recovered in step 602, the receiving system parses the ensemble loop and the mobile service loop of the FIC chunk payload, so as to verify the mapping of the ensemble identifier (ensemble_id) and the service identifier (service_id) transmitting the requested mobile service (S603). After performing step 603, the receiving system verifies the VNI_ID field value of the ensemble loop transmitting the reception-requested (or desired) mobile service (S604).

Thereafter, the receiving system verifies whether a VNI_ID field having the same value as the VNI_ID field value verified in step 604 exists in another ensemble loop (S605). If it is verified that the same VNI_ID field value does not exist in another ensemble, the one ensemble verified in step 604 is set as the VNI (S606). Alternatively, if it is verified in step 605 that the same VNI_ID field value exists in another ensemble, the receiving system verifies whether a plurality of RS frame decoders is provided therein (S607).

If the receiving system is provided with a single RS frame decoder, the receiving system cannot render the requested (or desired) mobile service. However, if the receiving system is provided with a plurality of RS frame decoders, the receiving system verifies the multiple ensembles transmitting the desired mobile service (S608). And, the at least one ensemble verified in step 608 is set as the VNI (S609). For example, when 3 ensembles having the same VNI_ID field value exist, and when the receiving system is provided with 2 RS frame decoders, 2 of the 3 ensembles are used to set-up the VNI.

Receiving System

Figure 17:
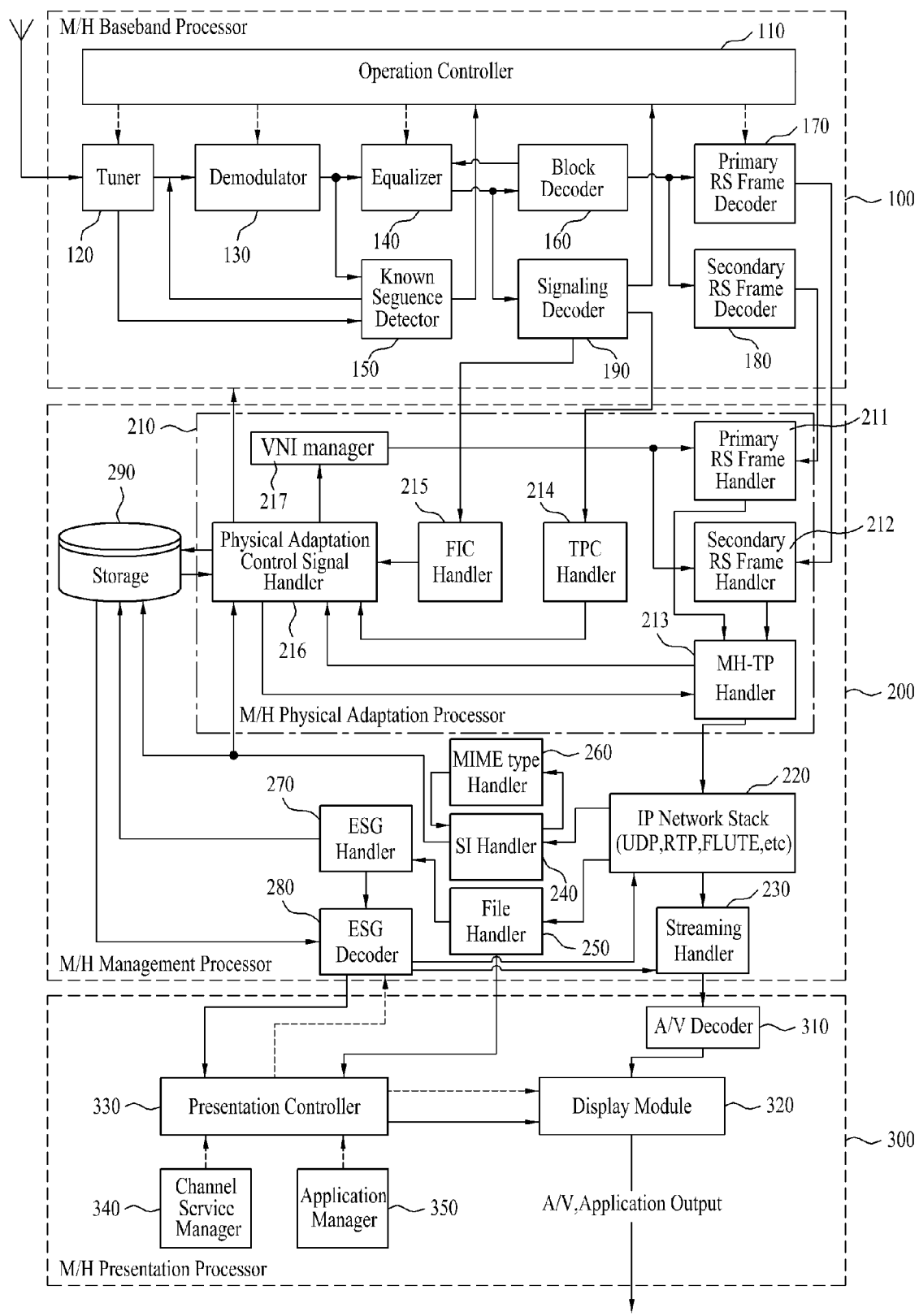
FIG. 17 illustrates a block diagram showing a general structure of a receiving system according to an embodiment of the present invention.

FIG. 17 illustrates a block view showing the structure of a digital broadcast receiving system according to an embodiment of the present invention. More specifically, FIG. 17 shows an example of a digital broadcast receiving system being provided with 2 RS frame decoders, i.e., a primary RS frame decoder and a secondary RS frame decoder. Therefore, in this embodiment of the present invention, one mobile service may be transmitted through multiple ensembles, and the receiving system may set-up the VNI with 2 ensembles.

The receiving system according to the present invention includes a baseband processor 100, a management processor 200, and a presentation processor 300.

The baseband processor 100 includes an operation controller 110, a tuner 120, a demodulator 130, an equalizer 140, a known sequence detector (or known data detector) 150, a block decoder (or mobile handheld block decoder) 160, a primary Reed-Solomon (RS) frame decoder 170, a secondary RS frame decoder 180, and a signaling decoder 190.

The operation controller 110 controls the operation of each block included in the baseband processor 100.

By tuning the receiving system to a specific physical channel frequency, the tuner 120 enables the receiving system to receive main service data, which correspond to broadcast signals for fixed-type broadcast receiving systems, and mobile service data, which correspond to broadcast signals for mobile broadcast receiving systems. At this point, the tuned frequency of the specific physical channel is down-converted to an intermediate frequency (IF) signal, thereby being outputted to the demodulator 130 and the known sequence detector 150.

The passband digital IF signal, which is outputted from the tuner 120, may include only the main service data, or include only the mobile service data, or include a combination of the main service data and the mobile service data. The mobile service data may correspond to RS frame data. Alternatively, the mobile service data may correspond to data required for mobile services within a data group.

The demodulator 130 performs self-gain control, carrier recovery, and timing recovery processes on the passband digital IF signal inputted from the tuner 120, thereby translating the IF signal to a baseband signal. Then, the demodulator 130 outputs the baseband signal to the equalizer 140 and the known sequence detector 150. The demodulator 130 uses the known data symbol sequence inputted from the known sequence detector 150 during the timing and/or carrier recovery, thereby enhancing the demodulating performance.

The equalizer 140 compensates channel-associated distortion included in the signal demodulated by the demodulator 130. Then, the equalizer 140 outputs the distortion-compensated signal to the block decoder 160. By using a known data symbol sequence inputted from the known sequence detector 150, the equalizer 140 may enhance the equalizing performance. Furthermore, the equalizer 140 may receive feedback on the decoding result from the block decoder 160, thereby enhancing the equalizing performance.

The known sequence detector 150 detects known data place (or position) inserted by the transmitting system from the input/output data (i.e., data prior to being demodulated or data being processed with partial demodulation). Then, the known sequence detector 150 outputs the detected known data position information and known data sequence generated from the detected position information to the demodulator 130 and the equalizer 140. Additionally, in order to allow the block decoder 160 to identify the mobile service data that have been processed with additional encoding by the transmitting system and the main service data that have not been processed with any additional encoding, the known sequence detector 150 outputs such corresponding information to the block decoder 160.

If the data channel-equalized by the equalizer 140 and inputted to the block decoder 160 correspond to data processed with both block-encoding and trellis-encoding using serial concatenated convolution code (SCCC) by the transmitting system (i.e., data within the RS frame), the block decoder 160 may perform trellis-decoding and block-decoding as inverse processes of the transmitting system. On the other hand, if the data channel-equalized by the equalizer 140 and inputted to the block decoder 160 correspond to data processed only with trellis-encoding and not block-encoding by the transmitting system (i.e., main service data), the block decoder 160 may perform only trellis-decoding.

The signaling decoder 190 decoded signaling data that have been channel-equalized and inputted from the equalizer 140. It is assumed that the signaling data (i.e., signaling information) inputted to the signaling decoder 190 correspond to data processed with both block-encoding and trellis-encoding by the transmitting system. Examples of such signaling data may include transmission parameter channel (TPC) data and fast information channel (FIC) data. For example, among the data that are being inputted, the signaling decoder 190 performs regressive turbo decoding of a parallel concatenated convolution code (PCCC) method on data corresponding to the signaling information region. Subsequently, the signaling decoder 190 separates FIC data and TPC data from the regressive-turbo-decoded signaling data. Additionally, the signaling decoder 190 performs RS-decoding as inverse processes of the transmitting system on the separated TPC data, thereby outputting the processed data to the TPC handler 214. Also, the signaling decoder 190 performs deinterleaving in sub-frame units on the separated FIC data, so as to perform RS-decoding as inverse processes of the transmitting system on the deinterleaved FIC data, thereby outputting the processed data to the FIC handler 215. The FIC data being deinterleaved and RS-decoded from the signaling decoder 190 and outputted to the FIC handler 215 are transmitted in units of FIC segments.

Meanwhile, according to the present invention, the transmitting system uses RS frames by encoding units. Herein, the RS frame may be divided into a primary RS frame and a secondary RS frame. However, according to the embodiment of the present invention, the primary RS frame and the secondary RS frame will be divided based upon the level of importance of the corresponding data.

The primary RS frame decoder 170 receives the data outputted from the block decoder 160. At this point, according to the embodiment of the present invention, the primary RS frame decoder 170 receives the data of the primary RS frame that have been Reed-Solomon (RS)-encoded and/or cyclic redundancy check (CRC)-encoded from the block decoder 160. The primary RS frame decoder 170 performs inverse processes of an RS frame encoder (not shown) included in the transmitting system, thereby correcting errors existing within the primary RS frame. More specifically, the primary RS frame decoder 170 forms a primary RS frame by grouping a plurality of data groups and, then, correct errors in primary RS frame units. A collection of consecutive primary RS frames processed with error correction becomes a primary ensemble. More specifically, a primary ensemble is formed of primary RS frames having CRC codes and RS parity removed therefrom.

Additionally, the secondary RS frame decoder 180 receives the data outputted from the block decoder 160. At this point, according to the embodiment of the present invention, the secondary RS frame decoder 180 receives the data of the secondary RS frame that have been RS-encoded and/or CRC-encoded from the block decoder 160. The secondary RS frame decoder 180 performs inverse processes of an RS frame encoder (not shown) included in the transmitting system, thereby correcting errors existing within the secondary RS frame. More specifically, the secondary RS frame decoder 180 forms a secondary RS frame by grouping a plurality of data groups and, then, correct errors in secondary RS frame units. A collection of consecutive secondary RS frames processed with error correction becomes a secondary ensemble. More specifically, a secondary ensemble is formed of secondary RS frames having CRC codes and RS parity removed therefrom.

Meanwhile, the management processor 200 according to an embodiment of the present invention includes an MH physical adaptation processor 210, an IP network stack 220, a streaming handler 230, a system information (SI) handler 240, a file handler 250, a multi-purpose internet main extensions (MIME) type handler 260, and an electronic service guide (ESG) handler 270, and an ESG decoder 280, and a storage unit 290.

The MH physical adaptation processor 210 includes a primary RS frame handler 211, a secondary RS frame handler 212, an MH transport packet (TP) handler 213, a TPC handler 214, an FIC handler 215, a physical adaptation control signal handler 216, and a virtual network interface (VNI) manager 217.

The TPC handler 214 extracts signaling information included in the TPC data outputted from the signaling decoder 190, thereby enabling the extracted signaling information to output to the physical adaptation control signal handler 216.

The TPC data may include a sub-frame number, a slot number, a parade identifier (parade id), a starting group number (SGN), a number of groups (NoG), a parade repetition cycle (PRC), an RS frame mode, an RS code mode, an SCCC block mode, an SCCC outer code mode, an FIC version, a parade continuity counter (PCC), a TNoG, and a TPC protocol version, and so on.

The sub-frame number information indicates the number of a current sub-frame within a corresponding M/H frame and is transmitted for M/H frame synchronization.

The slot number information is the current Slot number within the Sub-Frame.

The parade identifier information identifies the Parade to which this Group belongs. Each Parade in an M/H transmission shall have a unique Parade identifier. In this case, communication of the Parade identifier between the physical layer and the management layer shall be performed by means of an ensemble identifier formed by adding one bit to the left of the Parade identifier. If the Ensemble identifier is for the primary ensemble delivered through this Parade, the added MSB shall be '0'. Otherwise, if it is for the secondary ensemble, the added MSB shall be '1'.

The starting Group number (SGN) information shall be the first Slot number for a Parade to which this Group belongs (after the Slot numbers for all preceding Parades have been calculated). The number of Groups (NoG) information shall be the number of Groups in a Sub-Frame assigned to the Parade to which this Group belongs.

The Parade repetition cycle (PRC) information shall be the cycle time over which the Parade is transmitted, specified in units of M/H Frames. The RS frame mode information indicates whether a single parade carries a single RS frame or two RS frames. The RS code mode information indicates an RS code mode for a RS frame. The SCCC block mode information indicates how M/H blocks within a data group are allocated to SCCC block. The SCCC outer code mode information indicates an SCCC outer mode code for a data group. The FIC version information indicates a version of FIC data. The Parade continuity counter information is incremented to 0~15 and is incremented by 1 for each (PRC+1) M/H frame. For instance, if PRC=011, the Parade_continuity_counter field is incremented each fourth M/H frame.

The TNoG information indicates the total number of data groups to be transmitted during a Sub-Frame. The TPC protocol version information represents a version of the corresponding TPC syntax structure.

However, the information included in the TPC data presented herein is merely exemplary. And, since the adding or deleting of information included in the TPC may be easily adjusted and modified by one skilled in the art, the present invention will, therefore, not be limited to the examples set forth herein.

FIC handler 215 receives FIC data from the signaling decoder 190 so as to extract signaling information for service acquisition, i.e., mapping information between ensembles and the mobile service, thereby outputting the physical adaptation control signal handler 216. More specifically, the FIC handler 215 analyzes the headers of the respective FIC segments being outputted from the signaling decoder 190. Then, the FIC handler 215 recovers the FIC chunk from the payloads of the respective FIC segments by using the analysis result. Thereafter, the FIC handler 215 acquires signaling information from the recovered FIC chunk and outputs the acquired signaling information to the physical adaptation control signal handler 216.

The physical adaptation control signal handler 216 uses signaling information received from the TPC handler 214, the FIC handler 215, the M/H-TP handler 213, and the SI handler 240, so as to configure a service map. Then, the physical adaptation control signal handler 216 stores the configured service map to the storage unit 290 or provides the configured service map to the required block. If the FIC chunk payload is configured as shown in FIG. 9, the physical adaptation control signal handler 216 provides the service_span field value within the mobile service loop of the FIC chunk payload, as the VNI information, to the VNI manager 217.

The VNI manager 217 receives the FIC data including the VNI information from the physical adaptation control signal handler 216, so as to set-up at least one ensemble as the VNI. More specifically, depending upon the ensemble configuration of the mobile service, one ensemble or multiple ensembles is/are set as the VNI. Thereafter, the VNI manager 217 controls the operations of the primary RS frame handler 211 and the secondary RS frame handler 212 depending upon the VNI structure.

Based upon the control of the VNI manager 217, the primary RS frame handler 211 receives a primary RS frame of a primary ensemble from the primary RS frame decoder 170 of the baseband processor 100. Then, the primary RS frame handler 211 divides the received primary RS frame in row units so as to configure an M/H-TP, thereby outputting the configured M/H-TP to the M/H-TP handler 213. Based upon the control of the VNI manager 217, the secondary RS frame handler 212 receives a secondary RS frame of a secondary ensemble from the secondary RS frame decoder 180 of the baseband processor 100. Then, the secondary RS frame handler 212 divides the received secondary RS frame in row units so as to configure an M/H-TP, thereby outputting the configured M/H-TP to the M/H-TP handler 213.

For example, it is assumed that two types of ensemble information (i.e., ensemble 1 and ensemble 2) are transmitted through a single FIC chunk, and that two mobile services 30-2 and 30-3 are transmitted through ensemble 1, and that two mobile services 30-2 and 30-4 are transmitted through ensemble 2. It is also assumed that the service_id field value of FIG. 9 is used as the VNI information. Furthermore, it is assumed that an ensemble and a service entry of the FIC chunk payload are configured as shown in FIG. 11. Referring to FIG. 11, the service_span field value of mobile service 30-2 in an ensemble 1 loop is set to be equal to '01', and the service_span field value of mobile service 30-3 is set to be equal to '00'. And, the service_span field value of mobile service 30-2 in an ensemble 2 loop is set to be equal to '10', and the service_span field value of mobile service 30-4 is set to be equal to '00'.

In this example, since the receiving system includes two RS frame decoders 170 and 180, in case the requested (or desired) mobile service is mobile service 30-2, the VNI manager 217 sets-up the VNI with ensemble 1 and ensemble 2.

Then, in order to acquire the components of the mobile service 30-2 included in the ensemble 1, the VNI manager 217 controls the primary RS frame handler 211. And, in order to acquire the components of the mobile service 30-2 included in the ensemble 2, the VNI manager 217 controls the secondary RS frame handler 212.

The M/H-TP handler 213 extracts each header of the M/H-TP received from at least one of the primary RS frame handler 211 and the secondary RS frame handler 212, so as to determine the data included in the corresponding M/H-TP.

Then, when the determined data correspond to SI data (i.e., SI data that are not encapsulated to IP datagrams), the corresponding data are outputted to the physical adaptation control signal handler 216. Alternatively, when the determined data correspond to an IP datagram, the corresponding data are outputted to the IP network stack 220.

The IP network stack 220 processes broadcast data that are being transmitted in the form of IP datagrams. More specifically, the IP network stack 220 processes data that are inputted via user datagram protocol (UDP), real-time transport protocol (RTP), real-time transport control protocol (RTCP), asynchronous layered coding/layered coding transport (ALC/LCT), file delivery over unidirectional transport (FLUTE), and so on. Herein, when the processed data correspond to streaming data, the corresponding data are outputted to the streaming handler 230. And, when the processed data correspond to data in a file format, the corresponding data are outputted to the file handler 250. Finally, when the processed data correspond to SI-associated data, the corresponding data are outputted to the SI handler 240.

The SI handler 240 receives and processes SI data having the form of IP datagrams, which are inputted to the IP network stack 220.

More specifically, in case the data for the inputted SI corresponds to an MIME type, the SI handler 240 outputs the data to the MIME type handler 260. Also, the SI handler 240 analyzes table sections of a service signaling channel being outputted from the IP network stack 220, so as to acquire the signaling information. Thereafter, the SI handler 240 stores the acquired signaling information to the storage unit 290 or outputs the acquired signaling information to the physical adaptation control signal handler 216. According to an embodiment of the present invention, the service signaling channel includes a service map table (SMT) shown in FIG. 14.

The MIME-type handler 260 receives the MIME-type SI data outputted from the SI handler 240 and processes the received MIME-type SI data.

The file handler 250 receives data from the IP network stack 220 in an object format in accordance with the ALC/LCT and FLUTE structures. The file handler 250 groups the received data to create a file format. Herein, when the corresponding file includes ESG, the file is outputted to the ESG handler 270. On the other hand, when the corresponding file includes data for other file-based services, the file is outputted to the presentation controller 330 of the presentation processor 300.

The ESG handler 270 processes the ESG data received from the file handler 250 and stores the processed ESG data to the storage unit 290. Alternatively, the ESG handler 270 may output the processed ESG data to the ESG decoder 280, thereby allowing the ESG data to be used by the ESG decoder 280.

The storage unit 290 stores the system information (SI) received from the physical adaptation control signal handler 210 and the ESG handler 270 therein. Thereafter, the storage unit 290 transmits the stored SI data to each block.

The ESG decoder 280 either recovers the ESG data and SI data stored in the storage unit 290 or recovers the ESG data transmitted from the ESG handler 270. Then, the ESG decoder 280 outputs the recovered data to the presentation controller 330 in a format that can be outputted to the user.

The streaming handler 230 receives data from the IP network stack 220, wherein the format of the received data are in accordance with RTP and/or RTCP structures. The streaming handler 230 extracts audio/video streams from the received data, which are then outputted to the audio/video (A/V) decoder 310 of the presentation processor 300. The audio/video decoder 310 then decodes each of the audio stream and video stream received from the streaming handler 230.

The display module 320 of the presentation processor 300 receives audio and video signals respectively decoded by the A/V decoder 310. Then, the display module 320 provides the received audio and video signals to the user through a speaker and/or a screen.

The presentation controller 330 corresponds to a controller managing modules that output data received by the receiving system to the user.

The channel service manager 340 manages an interface with the user, which enables the user to use channel-based broadcast services, such as channel map management, channel service connection, and so on.

The application manager 350 manages an interface with a user using ESG display or other application services that do not correspond to channel-based services.

As described above, the receiving system and the data processing method of the same have the following advantages. The present invention may transmit a single mobile service through multiple ensembles. Also, by using a plurality of RS frame decoder, the present invention is capable of receiving and processing a single mobile service through multiple ensembles without any IP address collision. Particularly, in case a plurality of RS frame decoders is used to simultaneously receive and process multiple ensembles, different forward error correction (FEC) may be applied to each component, which configure the mobile service, with respect to the mobile service depending upon the characteristics and requirements of the corresponding mobile service.

More specifically, the present invention are highly protected against (or resistant to) any error that may occur when transmitting mobile service data through a channel. And, the present invention is also highly compatible to the conventional receiving system. Moreover, the present invention may also receive the mobile service data without any error even in channels having severe ghost effect and noise. Furthermore, by inserting known data in a particular position (or place) within a data region and transmitting the processed data, the receiving performance of the receiving system may be enhanced even in a channel environment that is liable to frequent changes. Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing broadcast data in a broadcast transmitter, the method comprising:
   performing, by a Reed Solomon (RS) frame encoder, RS encoding and Cyclic Redundancy Check (CRC) encoding on mobile service data for a mobile service in order to generate an RS frame belonging to an ensemble;
   mapping a portion of the RS frame into at least one of a plurality of regions of a data group, the data group including known data sequences, a fast information channel (FIC) segment and transmission parameter channel (TPC) data; and
   transmitting a transmission frame including the data group,
   wherein an FIC chunk includes an FIC chunk header and an FIC chunk payload,
   wherein the FIC chunk payload includes a first ensemble identifier for identifying the ensemble and first identification information for identifying whether the mobile service is carried through more than one ensemble,
   wherein the FIC chunk is segmented into a plurality of FIC segment payloads and the FIC segment in the transmitted data group includes an FIC segment header and one of the plurality of FIC segment payloads,
   wherein the FIC segment header includes a number of the FIC segment and a number of a last FIC segment among FIC segments divided from the FIC chunk, and
   wherein the TPC data comprise FIC version information for indicating an update of the FIC chunk.

2. The method of claim 1, wherein the ensemble includes a service map table (SMT) including service acquisition information for the mobile service data that form the mobile service, the service acquisition information including a second ensemble identifier having a same value as the first ensemble identifier.

3. The method of claim 2, wherein the service acquisition information further includes second identification information identifying whether the mobile service is carried through more than one ensemble and having a same value as the first identification information.

4. The method of claim 3, wherein at least the first or second identification information indicates whether the mobile service can be provided with only a portion of the mobile service carried through the ensemble.

5. A broadcast transmitter comprising:
   a Reed Solomon (RS) frame encoder for performing RS encoding and Cyclic Redundancy Check (CRC) encoding on mobile service data for a mobile service in order to generate an RS frame belonging to an ensemble;
   a group formatting means for mapping a portion of the RS frame into at least one of a plurality of regions of a data group, the data group including known data sequences, a fast information channel (FIC) segment and transmission parameter channel (TPC) data; and
   a transmitting means for transmitting a transmission frame including the data group,
   wherein an FIC chunk includes an FIC chunk header and an FIC chunk payload,
   wherein the FIC chunk payload includes a first ensemble identifier for identifying the ensemble and first identification information for identifying whether the mobile service is carried through more than one ensemble,
   wherein the FIC chunk is segmented into a plurality of FIC segment payloads and the FIC segment in the transmitted data group includes an FIC segment header and one of the plurality of FIC segment payloads,
   wherein the FIC segment header includes a number of the FIC segment and a number of a last FIC segment among FIC segments divided from the FIC chunk, and
   wherein the TPC data comprise FIC version information for indicating an update of the FIC chunk.

6. The broadcast transmitter of claim 5, wherein the ensemble includes a service map table (SMT) including service acquisition information for the mobile service data that form the mobile service, the service acquisition information including a second ensemble identifier having a same value as the first ensemble identifier.

7. The broadcast transmitter of claim 6, wherein the service acquisition information further includes second identification information identifying whether the mobile service is carried through more than one ensemble and having a same value as the first identification information.

8. The broadcast transmitter of claim 7, wherein at least the first or second identification information indicates whether the mobile service can be provided with only a portion of the mobile service carried through the ensemble.

* * * * *